US012706253B2

(12) United States Patent
Andree

(10) Patent No.: US 12,706,253 B2
(45) Date of Patent: Aug. 11, 2026

(54) METHODS AND APPARATUS FOR PROVIDING STORAGE CELL FOR ENERGY STORAGE DEVICE

(71) Applicant: FASTCAP ULTRACAPACITORS LLC, Woburn, MA (US)

(72) Inventor: Wyatt Andree, Revere, MA (US)

(73) Assignee: FASTCAP ULTRACAPACITORS LLC, Wakefield, MA (US)

( * ) Notice: Subject to any disclaimer, the term of this patent is extended or adjusted under 35 U.S.C. 154(b) by 100 days.

(21) Appl. No.: 18/014,845

(22) PCT Filed: Jul. 7, 2021

(86) PCT No.: PCT/US2021/040625
§ 371 (c)(1),
(2) Date: Jan. 6, 2023

(87) PCT Pub. No.: WO2022/010976
PCT Pub. Date: Jan. 13, 2022

(65) Prior Publication Data

US 2023/0274893 A1 Aug. 31, 2023

Related U.S. Application Data

(60) Provisional application No. 63/048,874, filed on Jul. 7, 2020.

(51) Int. Cl.
*H01G 11/78* (2013.01)
*H01G 11/28* (2013.01)
(Continued)

(52) U.S. Cl.
CPC ............. *H01G 11/48* (2013.01); *H01G 11/28* (2013.01); *H01G 11/52* (2013.01); *H01G 11/68* (2013.01);
(Continued)

(58) Field of Classification Search
CPC ........ H01G 11/78; H01G 11/28; H01G 11/52; H01G 11/68; H01G 11/84; H05K 1/181; H05K 2201/10015; H10G 4/32
(Continued)

(56) References Cited

U.S. PATENT DOCUMENTS 3,163,807 A * 12/1964 Linderholm ........... H01G 4/385 29/25.42
8,320,104 B2 * 11/2012 Fujimoto ............... H01G 9/028 361/511
(Continued)

FOREIGN PATENT DOCUMENTS

JP 2001155775 A 6/2001
JP 2005210064 A * 8/2005 .......... H01M 50/536
(Continued)

OTHER PUBLICATIONS

International Search Report with Written Opinion for International Application No. PCT/US2021/040625; Application Filing Date Jul. 7, 2021; Date of Mailing Oct. 25, 2021 (17 pages).
(Continued)

*Primary Examiner* — Arun Ramaswamy

(57) ABSTRACT

An energy storage apparatus for mounting on a printed circuit board using a solder reflow process includes: a sealed housing body including a positive internal contact and a negative internal contact disposed within the body and in electrical communication with respective external contacts. An electric double layer capacitor energy storage cell is disposed within the body Methods of manufacture are disclosed.

14 Claims, 22 Drawing Sheets

(51) Int. Cl.
*H01G 11/48* (2013.01)
*H01G 11/52* (2013.01)
*H01G 11/68* (2013.01)
*H01G 11/84* (2013.01)
*H05K 1/181* (2026.01)

(52) U.S. Cl.
CPC ............. *H01G 11/84* (2013.01); *H05K 1/181* (2013.01); *H05K 2201/10015* (2013.01)

(58) Field of Classification Search
USPC ........ 361/502, 503, 508, 516, 530, 511, 520
See application file for complete search history.

(56) References Cited

U.S. PATENT DOCUMENTS

| | | | | |
|---|---|---|---|---|
| 11,158,464 | B2 * | 10/2021 | Will | H01G 9/145 |
| 2003/0180605 | A1 | 9/2003 | Mizutani | |
| 2010/0053844 | A1 * | 3/2010 | Eilertsen | H01G 11/28<br>361/502 |
| 2011/0157778 | A1 * | 6/2011 | Fujimoto | H01G 9/10<br>361/531 |
| 2012/0236465 | A1 * | 9/2012 | Kondo | H01G 9/008<br>29/25.03 |
| 2013/0029205 | A1 * | 1/2013 | Adams | H01M 4/70<br>429/185 |
| 2014/0042988 | A1 * | 2/2014 | Kuttipillai | H01M 50/437<br>320/167 |
| 2017/0316889 | A1 * | 11/2017 | Martini | H01G 11/52 |
| 2018/0034094 | A1 * | 2/2018 | Liu | H01M 4/483 |
| 2019/0371534 | A1 | 12/2019 | Brambilla et al. | |
| 2020/0020488 | A1 | 1/2020 | Martini et al. | |

FOREIGN PATENT DOCUMENTS

| | | | |
|---|---|---|---|
| JP | 2019160544 | A | 9/2019 |
| WO | 2015102716 | A8 | 7/2015 |
| WO | 2016057983 | A3 | 4/2016 |
| WO | 2016204820 | A2 | 12/2016 |
| WO | 2018102652 | A1 | 6/2018 |
| WO | 2019070897 | A1 | 4/2019 |

OTHER PUBLICATIONS

European Search Report for European Patent Application No. 21838362.8 mailed Apr. 8, 2025.

Office Action for the corresponding Japanese Application No. 2023-501036, Date of Mailing: Jul. 29, 2025; 1 1 page, English summary.

English Translation of Japanese Office Action for corresponding Japanese Application No. 2023-501036, Date of issue: Feb. 17, 2026; 5 pages.

* cited by examiner

Internal Resistance of Nanoramic SD85-500

- ESR degradation is less than 65% after 1500 hours at 100°C

Capacitance of Nanoramic SD85-500

- About 30% degradation in capacitance after 1500 hours at 100°C

METHODS AND APPARATUS FOR PROVIDING STORAGE CELL FOR ENERGY STORAGE DEVICE

CROSS REFERENCE TO RELATED APPLICATIONS

This application is a National Stage application of PCT/US2021/040625, filed Jul. 7, 2021, which claims the benefit of U.S. Provisional Application No. 63/048,874, filed Jul. 7, 2020, both of which are incorporated by reference in their entirety herein.

BACKGROUND OF THE INVENTION

1. Field of the Invention

The invention disclosed herein relates to energy storage devices and, in particular, to an energy storage device configured for mounting to an electrical circuit board.

2. Description of the Related Art

A myriad of devices make use of electronics having components disposed onto circuit boards. As with all electronics, an effective power supply is a requirement for powering the components. One technique for providing local power on a circuit board involves the use of energy storage devices, such as batteries and capacitors.

Generally, conventional capacitors provide less than about 360 Joules per kilogram of specific energy, whereas a conventional alkaline battery has a density of about 590 kJ/kg. Ultracapacitors (also referred to as "supercapacitors"), can accept and deliver charge much faster than batteries and tolerate many more charge and discharge cycles than rechargeable batteries. This makes implementation of ultracapacitors an attractive solution for electrical engineers.

As first design obstacle is that typical ultracapacitors can be substantially larger than conventional batteries for a given charge. Even with advancements in power density, another problem is process oriented. That is, assembly of an electrical circuit requires soldering of components to a circuit board. This "reflow process" generates heat that is substantial enough to degrade or destroy conventional ultracapacitors. Thus, while use of an ultracapacitor may be an attractive solution for powering electronics mounted on a circuit board, this solution has not been available to compact designs requiring high power output. Beyond that, a further problem with existing ultracapacitor technology is the limited lifetime of such components.

What are needed are ultracapacitors that are useful for powering electrical components disposed on a circuit board. Preferably, the ultracapacitors offer a compact design that is suited to the ever-shrinking size of the components, are capable of surviving reflow processing and provide a useful lifetime of operation.

SUMMARY

In one aspect, an energy storage apparatus suitable for mounting on a printed circuit board using a solder reflow process is disclosed. In some embodiments, the apparatus includes: a sealed housing body (e.g., a lower body with a lid attached thereto) including a positive internal contact and a negative internal contact (e.g., metallic contact pads) disposed within the body and each respectively in electrical communication with a positive external contact and a negative external contact. Each of the external contacts provide electrical communication to the exterior of the body and may be disposed on an external surface of the body. An electric double layer capacitor (EDLC) (also referred to herein as an "ultracapacitor" or "supercapacitor") energy storage cell is disposed within a cavity in the body including a stack of alternating electrode layers and electrically insulating separator layers. An electrolyte is disposed within the cavity and wets the electrode layers. A positive lead electrically connects a first group of one or more of the electrode layers to the positive internal contact; and a negative lead electrically connects a second group of one or more of the electrode layers to the negative internal contact.

In some embodiments, each of the electrode layers includes an energy storage media that is substantially free from binding agents and consists essentially of carbonaceous material. In some embodiments, the energy storage media includes a network of carbon nanotubes defining void spaces; and a carbonaceous material (e.g., activated carbon) located in the void spaces and bound by the network of carbon nanotubes. In some embodiments, at least one electrode layer includes a double-sided electrode layer having energy storage media disposed on opposing surfaces of a conductive current collector layer.

In some embodiments, surfaces of the energy storage cell in physical contact with body consist of electrically insulating material (e.g., layers separator material, or in some embodiments an insulating envelope barrier disposed around the cell).

In some embodiments, each of the electrode layers includes a conductive tab attached to either one of the positive lead and the negative lead. For example, a group of positive electrodes may include tabs connected to the positive lead, e.g., using ultrasonic welding or other suitable techniques (and similarly for the negative case).

In various embodiments, it may be desirable to prevent corrosion and other related deleterious effects by isolating electrochemically active portions of the apparatus that may otherwise come in contact with the electrolyte during operation. Accordingly, some embodiments include one or more corrosion prevention features, e.g., a feature located proximal to one of the internal contacts and configured to limit electrochemical reaction between said internal contact and the electrolyte during operation. In some embodiments, the internal contact includes a first material having a relatively high electrochemical activity with the electrolyte and the corrosion prevention feature includes a protective layer of a second material having a relatively lower electrochemical activity with the electrolyte than the first material, said protective layer disposed to prevent contact between the first material and the electrolyte. In some embodiments, the protective layer includes a layer of sealant, e.g., of the types described herein. In some embodiments, the protective layer includes a metallic layer disposed on a surface of the first material. In some embodiments, the protective layer includes a metallic layer disposed on a surface of the first material and a sealant layer disposed on the metallic layer. In some embodiments, the metallic layer includes a metallic shim secured or partially secured (e.g., to the internal contact) by the sealant layer. In some embodiments, an interior surface of the body includes a recessed portion configured to receive at least a portion of the corrosion prevention feature. In some embodiments, a portion of the positive or negative lead extends through the corrosion prevention feature to connect to one of the internal contacts. In some embodiments, the corrosion prevention feature includes an aluminum metallic layer. In some embodiments, the corrosion prevention feature includes an epoxy sealant.

Some embodiments include an electrically insulating envelope barrier enclosing the energy storage cell and the electrolyte, configured to prevent contact of the electrolyte and energy storage cell with the surfaces of the cavity. In some embodiments, the leads extend through the barrier from the energy storage cell to the internal contacts. In some embodiments, the barrier is heat sealed to the leads to prevent leakage of electrolyte from within the barrier envelope.

In some embodiments, the body is a chip (e.g., a ceramic based microchip package) configured for surface mounting on a printed circuit board, wherein, when so mounted, the chip extends no more than about 5.0 mm, 4.0 mm, 3.5 mm, 3.0 mm or less above the major surface of the printed circuit board.

In some embodiments, the apparatus may have an operating voltage of at least 2.0 V, 2.1, V, 2.2 V, 2.3 V, 2.4 V, 2.5 V, 3.0 V, or more. In some embodiments, the apparatus may have a capacitance of at least 300 mF, 400 mF, 450 mF, 500 mF or more. In some embodiments, the apparatus may have an energy density of at least 4.0 J/cc, 4.5 J/cc, 5.0 J/cc, 5.1 J/cc or more. In some embodiments, the apparatus may have a peak power density of at least 15 W/cc, at least 20 W/cc, at least 22 W/cc, or more. In some embodiments, the apparatus may have an equivalent series resistance of 500 mΩ or less, an equivalent series resistance of 400 mΩ or less, an equivalent series resistance of 300 mΩ or less. In some embodiments, the apparatus may have an operating temperature rating of at least 65° C., 75° C., 85° C., 100° C., 125° C., 150° C., or more.

In some embodiments, the apparatus may have an operational lifetime of at least 2,000 hours at an operating voltage of at least 2.0 V (or at least 2.1 V or more) and an operating temperature of at least 65° C. while exhibiting a capacitance degradation of less that 30% and an equivalent series resistance increase of less than 100%. In some embodiments, the apparatus may have an operational lifetime of at least 1,000 hours, at least 1,500 hours, at least 2,000 hours, at least 3,000 hours, or more at an operating voltage of at least 2.0 V (or at least 2.1 V or more) and an operating temperature of at least 85° C. while exhibiting a capacitance degradation of less than 30% and an equivalent series resistance increase of less than 100%. In some embodiments, the apparatus may have an operational lifetime of at least 1,000 hours, at least 1,500 hours, at least 2,000 hours, at least 3,000 hours, or more at an operating voltage of at least 2.0 V (or at least 2.1 V or more) and an operating temperature of at least 100° C. while exhibiting a capacitance degradation of less than 30% and an equivalent series resistance increase of less than 100%. In some embodiments, the operational lifetime occurs after the apparatus has been soldered to a printed circuit board using a reflow process having at least one, two, three, four, five, six, or more temperature cycles of at least 30 seconds, 60 seconds, 120 seconds, 180 seconds, 240 seconds, 360 seconds, or more with a peak temperature of at least 100° C., 200° C., 250° C., 300° C., or more.

In some embodiments, the energy storage cell provides power (e.g., back up power) to at least one additional element mounted to the circuit board (e.g., a solid state memory device).

In some embodiments, the electrolyte includes an ionic liquid which in some embodiments may be mixed with a salt and/or a solvent, e.g., of the types described herein.

In some embodiments, the housing body is hermetically sealed. For example, in some embodiments a metallic lid may be attached (e.g., welded) to a ceramic element to form the housing body, as described in detail herein.

In some embodiments, within the cavity of the housing body containing the energy storage cell a total concentration of halide ions is kept to below about 1,000 ppm, 500 ppm, 200 ppm, 100 ppm or less. In some embodiments, within the cavity of the housing body containing the energy storage cell metallic species impurities are kept to below about 1,000 ppm, 500 ppm, 200 ppm, 100 ppm or less. In some embodiments, within the cavity of the housing body containing the energy storage cell impurities of bromoethane, chloroethane, 1-bromobutane, 1-chlorobutane, 1-methylimidazole, ethyl acetate, and methylene chloride are kept to below about 1,000 ppm, 500 ppm, 200 ppm, 100 ppm or less. In some embodiments, within the cavity of the housing body containing the energy storage cell moisture is kept to below about 1,000 ppm, 500 ppm, 200 ppm, 100 ppm, 50 ppm, 10 ppm or less. In some embodiments, within the cavity of the housing body containing the energy storage cell halide impurities are kept to below about 1,000 ppm, 500 ppm, 200 ppm, 100 ppm, 50 ppm, 10 ppm or less.

In some embodiments, the apparatus includes a single energy storage cell contained in the sealed housing body, in other words, one energy storage cell per chip. In other embodiments, each chip may include multiple energy storage cells, e.g., disposed together within a common cavity, or in separate cavities, or in a combination thereof.

In another aspect, a method is disclosed of making an energy storage apparatus suitable for mounting on a printed circuit board using a solder reflow process. In some embodiments, the method includes: forming an electric double layer capacitor (EDLC) energy storage cell including a stack of alternating electrode layers and electrically insulating separator layers; disposing the energy storage cell within a housing body, the body including a positive internal contact and a negative internal contact disposed within the body; at least partially filling the body with electrolyte to wet the electrode layers; electrically connecting a positive lead from a first group of one or more of the electrode layers to the positive internal contact; electrically connecting a negative lead from a second group of one or more of the electrode layers to the negative internal contact; and sealing the housing body with the energy storage cell disposed within the cavity. In some embodiments, sealing the housing body includes hermetically sealing the housing body (e.g., to provide low impurity conditions as described herein).

In another aspect, a method of is disclosed of providing energy to a device mounted on a printed circuit board. In some embodiment, the method may include mounting the apparatus of the type described herein to the printed circuit board using a solder reflow process; and repetitively charging and discharging the apparatus at an operating voltage and operating temperature to provide energy to a device In some embodiments, the operating voltage is at least 2.0 V, 2.1 V, 2.2 V, 2.3 V, 2.4 V, 2.5 V, 2.75 V, 3.0 V or more. In some embodiments, the operating temperature is at least 65° C., at least 85° C., at least 100° C., at least 125° C., at least 150° C., or more. In some embodiments, the method includes repetitively charging and discharging the apparatus at an operating voltage and operating temperature to provide energy to a device for at least 2,000 hours while the apparatus exhibits a capacitance degradation of less than 30% and an equivalent series resistance increase of less than 100%.

Various embodiments may include any of the features and elements described herein, either alone or in any suitable combination.

BRIEF DESCRIPTION OF THE DRAWINGS

The features and advantages of the invention are apparent from the following description taken in conjunction with the accompanying drawings in which.

DETAILED DESCRIPTION

Disclosed herein are apparatus useful for fabricating an energy storage cell. Once fabricated, the energy storage cell is loaded into a housing which is then filled with electrolyte and sealed. The sealed device is then available for use by an end-user.

In the examples provided herein, the energy storage cell is designed for an ultracapacitor, however, other types of energy storage devices, such as batteries may benefit from that which is disclosed herein. In the examples provided herein, the energy storage device is a "chip cap." The chip cap is an ultracapacitor type energy storage device useful for providing energy to a circuit board. Advantageously, the chip cap is capable of withstanding the demands associated with manufacture and assembly of board mounted circuits and subsequently delivering superior performance over prior art energy storage devices.

Prior to introducing the energy storage device, some terminology is provided to establish context for the teachings herein.

Embodiments of the energy storage device may be referred to herein as "ultracapacitor" and further as a "chip cap." The term "chip cap" generally refers to embodiments of an ultracapacitor that are suited to surface mounting on a printed circuit board (PCB). Generally, the term "chip cap" is with reference to conventional microchip style components that are mountable to a circuit board (i.e., the chip) and the ultracapacitor technology that is included therein.

As used herein, the term "reflowable" generally refers to capabilities of the energy storage device disclosed herein to survive manufacturing processes associated with surface mounting to a circuit board. The manufacturing processes may involve soldering (i.e., a reflow process) where process temperatures include heating cycles that heat components upwards of 150 degrees Celsius, in some cases to 200 degrees Celsius, and possibly to 220 degrees Celsius, or more. Such heating cycles may last for a duration of 30, 60, 90, 120, 240, 360 seconds or more. Thus, as discussed herein, a "reflowable" component is one that can withstand heating cycles appropriate for incorporation of the component into the board mounted circuit without experiencing substantially degraded future performance. In some embodiments, the components described herein may withstand multiple such reflow cycles, e.g., two, three, four, five, or more such cycles.

In some embodiments, a reflowable component may actually exhibit degraded performance, however, the degradation may be expected and the final installation (i.e., assembled or mounted component) may exhibit a predicted level of performance that is deemed acceptable.

Prior to introducing the chip cap, some general aspects of an electrochemical double-layer capacitor (EDLC) are set forth below and in conjunction with FIG. 1. Examples presented herein are not limiting of the technology, are merely illustrative and provided for purposes of explanation.

Figure 1:
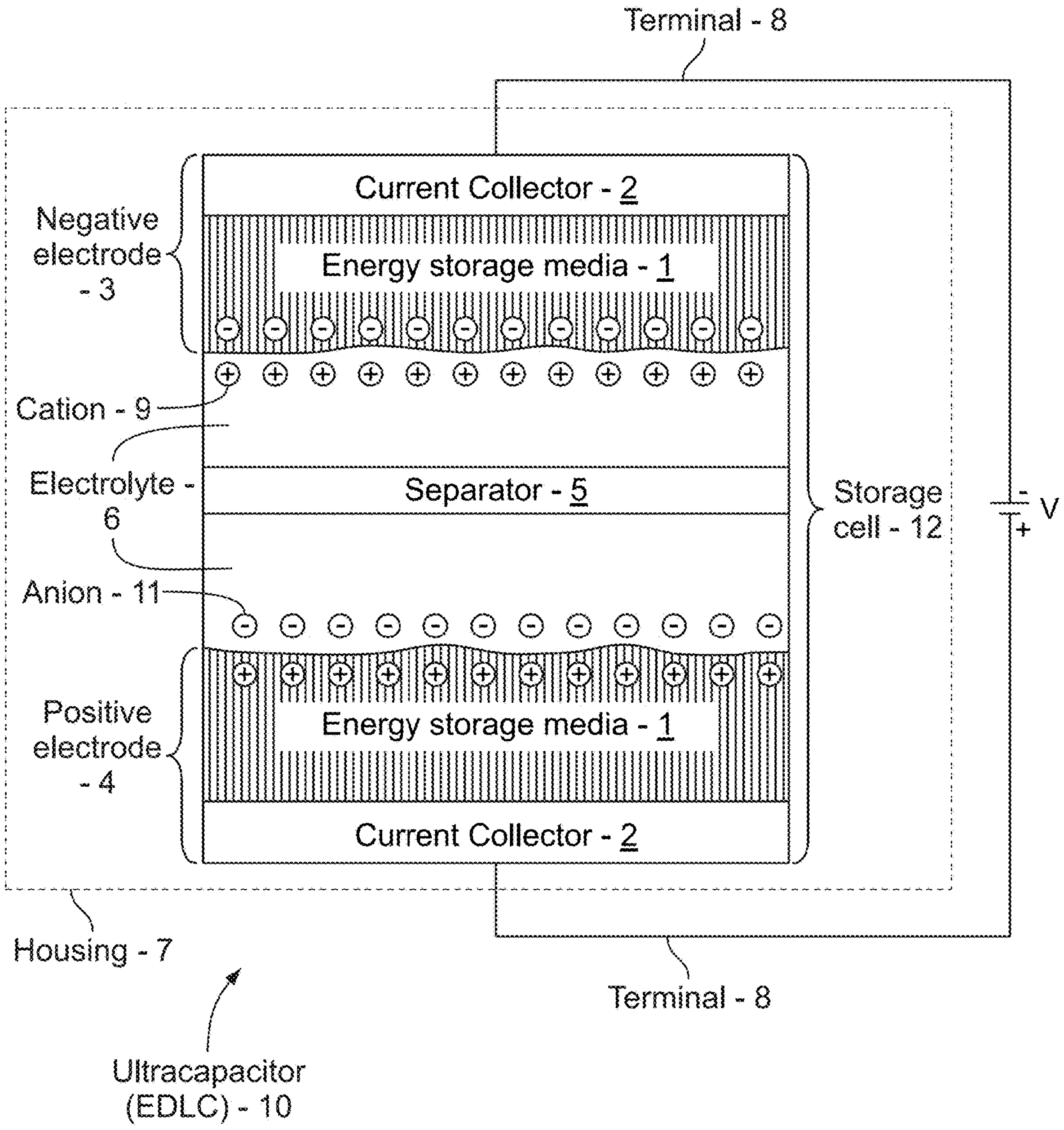
FIG. 1 is an schematic diagram depicting aspects of an exemplary energy storage device, in this instance, an ultracapacitor.

FIG. 1 depicts concepts associated with an exemplary embodiment of an electrochemical double-layer capacitor (EDLC) 10, also referred to as an "ultracapacitor." The ultracapacitor 10 includes two electrodes (a negative electrode 3 and a positive electrode 4), each electrode 3, 4 having a double layer of charge at an electrolyte interface. In some embodiments, a plurality of electrodes is included. However, for purposes of discussion and illustration, only two electrodes 3, 4 are shown in FIG. 1. As a matter of convention herein, each of the electrodes 3, 4 use a carbon-based energy storage media 1 (as discussed further herein) to provide energy storage.

Each of the electrodes 3, 4 include a respective current collector 2. In the ultracapacitor 10, the electrodes 3, 4 are separated by a separator 5. In general, the separator 5 is a thin structural material (usually a sheet) used to separate the electrodes 3, 4, into two or more compartments.

At least one form of electrolyte 6 is included. The electrolyte 6 fills void spaces in and between the electrodes 3, 4 and the separator 5. In general, the electrolyte 6 is a chemical compound that disassociates into electrically charged ions. A solvent that dissolves the chemical compound may be included in some embodiments. A resulting electrolytic solution conducts electricity by ionic transport.

As a matter of convenience, a combination of the electrodes 3, 4, the separator 5 and the electrolyte 6 are referred to as a "storage cell 12," and may be referred to as a "storage element." In some embodiments, the term "storage cell" merely makes reference to the electrodes 3, 4 and the separator 5 without the electrolyte 6.

Generally, the exemplary ultracapacitor 10 is packaged into a housing 7 (which may be referred to simply as the "housing 7") in a manner discussed further herein. The housing 7 is hermetically sealed. In various examples, the package is hermetically sealed by techniques making use of laser, ultrasonic, and/or welding technologies. The housing 7 (also referred to as a "case" or "package") includes at least one terminal 8. Each terminal 8 provides electrical access to energy stored in the energy storage media 1.

In the exemplary EDLC 10, the energy storage media 1 may be provided by and include activated carbon, carbon fibers, rayon, graphene, aerogel, carbon cloth, and/or carbon nanotubes. Activated carbon electrodes can be manufactured, for example, by producing a carbon base material by carrying out a first activation treatment to a carbon material obtained by carbonization of a carbon compound, producing a formed body by adding a binder to the carbon base material, carbonizing the formed body, and finally producing an active carbon electrode by carrying out a second activation treatment to the carbonized formed body.

Carbon fiber electrodes can be produced, for example, by using paper or cloth pre-form with high surface area carbon fibers.

In one specific example, multiwall carbon nanotubes (MWNT) on a variety of substrates using chemical vapor deposition (CVD) are fabricated for use in the electrodes 3, 4. In one embodiment, low-pressure chemical vapor deposition (LPCVD) is used. The fabrication process may use a gas mixture of acetylene, argon, and hydrogen, and an iron catalyst deposited on the substrate using electron beam deposition and or sputtering deposition.

In some embodiments, material used to form the energy storage media 1 may include material other than pure carbon. For example, various formulations of materials for providing a binder may be included. In general, however, the energy storage media 1 is substantially formed of carbon, and is therefore referred to as a "carbonaceous material."

In short, although formed predominantly of carbon, the energy storage media 1 may include any form of carbon, and any additives or impurities as deemed appropriate or acceptable, to provide for desired functionality as the energy storage media 1.

The electrolyte 6 includes a pairing of a plurality of cations 9 and anions 11, and, in some embodiments, may include the solvent. Various combinations of each may be used. In the exemplary EDLC 10, the cation 11 may include 1-(3-cyanopropyl)-3-methylimidazolium, 1,2-dimethyl-3-propylimidazolium, 1,3-bis(3-cyanopropyl)imidazolium, 1,3-diethoxyimidazolium, 1-butyl-1-methylpiperidinium, 1-butyl-2,3-dimethylimidazolium, 1-butyl-3-methylimidazolium, 1-butyl-4-methylpyridinium, 1-butylpyridinium, 1-decyl-3-methylimidazolium, 1-ethyl-3-methylimidazolium, 3-methyl-1-propylpyridinium, 1-butyl-1-methylpyrrolidinium bis(trifluoromethylsulfonyl)imide and combinations thereof as well as other equivalents as deemed appropriate.

In the exemplary EDLC 10, the anion 9 may include bis(trifluoromethanesulfonate)imide, tris(trifluoromethanesulfonate)methide, dicyanamide, tetrafluoroborate, hexafluorophosphate, trifluoromethanesulfonate, bis(pentafluoroethanesulfonate)imide, thiocyanate, trifluoro(trifluoromethyl)borate, spiro-(1,1')-bipyrrolidinium tetrafluoroborate salt, another potential salt is tetraethylammonium tetrafluoroborate and combinations thereof as well as other equivalents as deemed appropriate.

The solvent may include acetonitrile, amides, benzonitrile, butyrolactone, cyclic ether, dibutyl carbonate, diethyl carbonate, diethylether, dimethoxyethane, dimethyl carbonate, dimethylformamide, dimethylsulfone, dioxane, dioxolane, ethyl formate, ethylene carbonate, ethylmethyl carbonate, lactone, linear ether, methyl formate, methyl propionate, methyltetrahydrofuran, nitrile, nitrobenzene, nitromethane, n-methylpyrrolidone, propylene carbonate, sulfolane, sulfone, tetrahydrofuran, tetramethylene sulfone, thiophene, ethylene glycol, diethylene glycol, Methylene glycol, polyethylene glycols, carbonic acid ester, γ-butyrolactone, nitrile, tricyanohexane, butyronitrile, ethylene carbonate, methylene dichloride any combination thereof or other material(s) that exhibit appropriate performance characteristics.

The separator 5 may be fabricated from non-woven glass. The separator 5 may also be fabricated from fiberglass, fluoro-polymers, Teflon® (PTFE), and ceramics. For example, using non-woven glass, the separator 5 may include main fibers and binder fibers each having a fiber diameter smaller than that of each of the main fibers and allowing the main fibers to be bonded together.

As noted above, embodiments presented herein are generally with regard to ultracapacitors. The technologies may be equally useful in assembly of storage cells useful for batteries.

Definition/Distinction for EDLC/Batteries

The foregoing description of concepts related to an ultracapacitor 10 provide context for the chip cap disclosed herein and discussed below.

Figure 2:
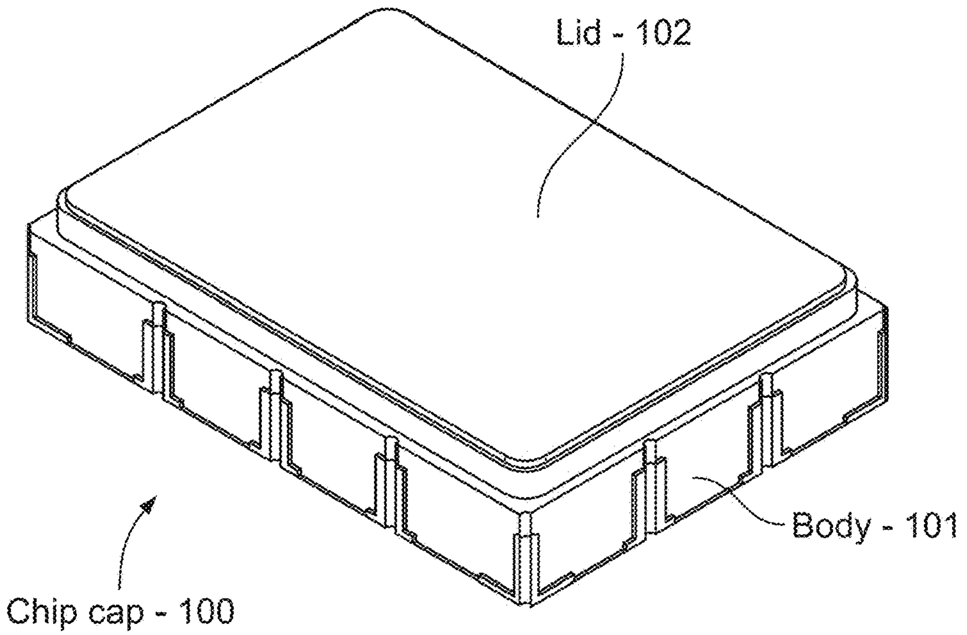
FIG. 2 is an isometric view depicting an embodiment of a chip cap according to the teachings herein.
Figure 3:
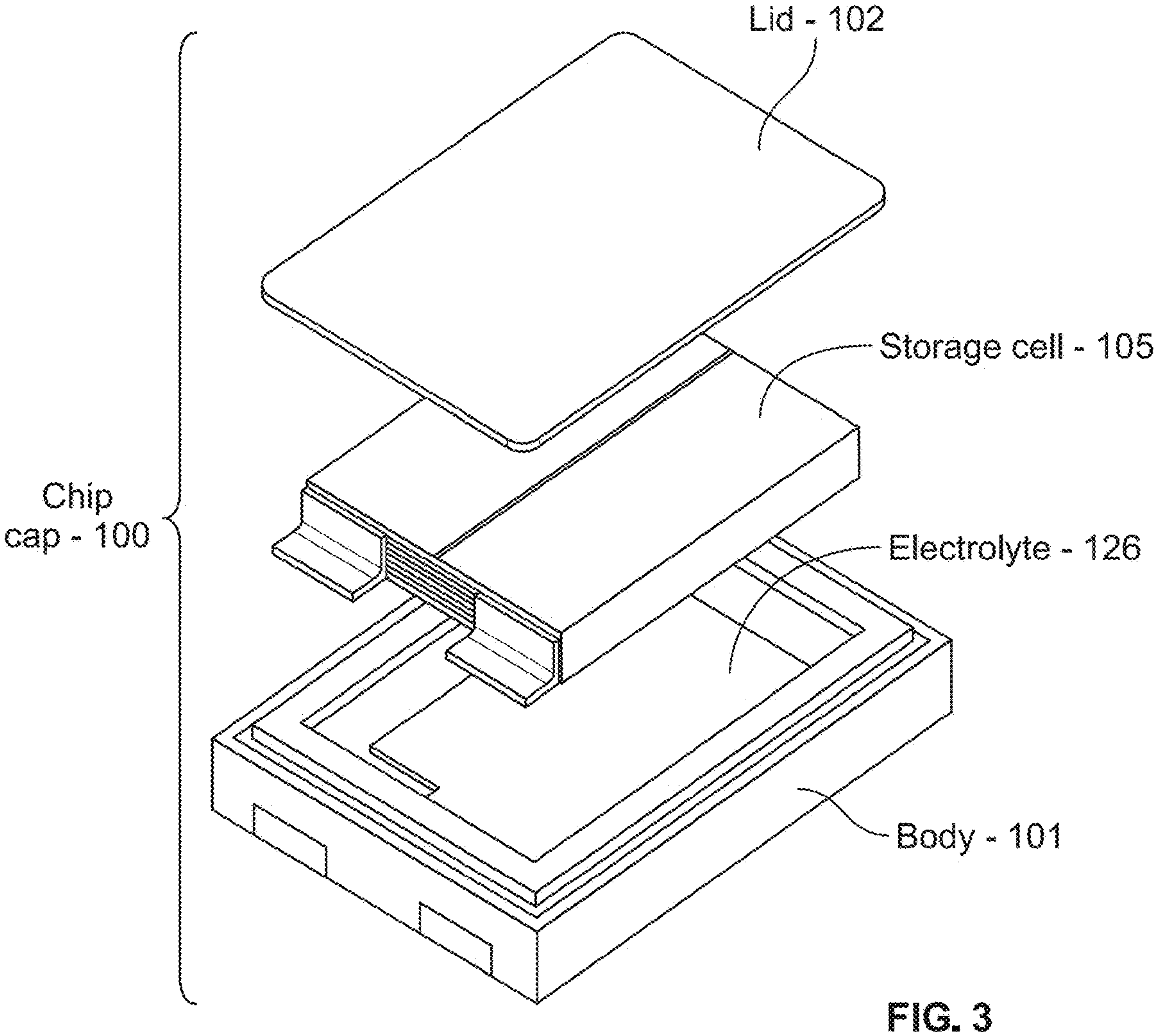
FIG. 3 is exploded view of the chip cap of FIG. 2 (from an opposing angle)

In the illustrations of FIG. 2 and FIG. 3, the chip cap 100 includes a body 101 and a lid 102 mounted thereto. Disposed within the body 101 and lid 102 is a volume 103 that contains a chip cap storage cell 105 immersed in or wetted with electrolyte 126. The body 101 may also be referred to as a part of the housing 7, or as a "container" or a "package" and by other similar terms. Generally, the chip cap storage cell 105 operates by principles set forth above with regard to the ultracapacitor storage cell 12. Further aspects of the chip cap storage cell 105 (hereafter referred to as the "storage cell 105" are set forth below.

In some embodiments the body 101 and lid 102 mounted thereto may have dimensions chosen to be suitable for microelectronics applications. For example, in some embodiments, body 101 and lid mounted thereto are configured for surface mounting on a printed circuit board, wherein, when so mounted, the body 101 and lid 102 extends no more than about 5.0 mm, 4.0 mm, 3.5 mm, 3.0 mm or less above the major surface of the printed circuit board. In some embodiments the body 101 has a maximum lateral dimension of less than about 5.0 cm, 4.0, cm, 3.0 cm, 2.0 cm, 1.0 cm, 0.5 cm, 0.25 cm or less. In some embodiments the body 101 occupies a lateral surface area of less than 25.0 cm^2, 16.0 cm^2, 9.0 cm^2, 1.0 cm^2, 0.25 cm^2, 0.1 cm^2, 0.075 cm^2, 0.05 cm^2 or less.

In some embodiments a side of the lid 102 facing the interior of the body 101 may include a protective coating or layer (e.g., of a polymer or plastic material such as PTFE or polyimide) to prevent unwanted physical or electrical contact between the lid and the storage cell 105.

The process of building the chip cap 100 begins with fabrication of the storage cell 105 and preparation of the body 101.

Figure 4A:
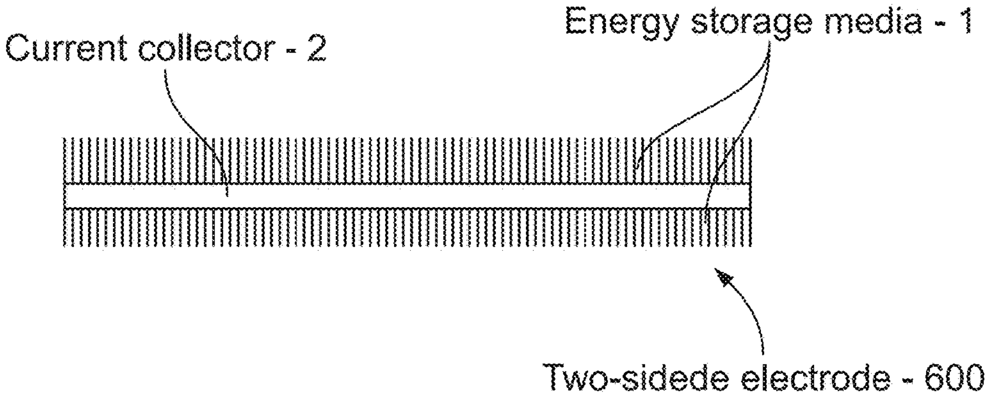
FIGS. 4A, 4B and 4C, collectively referred to herein as FIG. 4, are illustrations of electrodes for the chip cap of FIG. 2.

The first step in building the storage cell 105 involves preparation of the electrodes. An example of a two-sided electrode 600 is shown in FIG. 4A. Generally, and as shown in FIG. 4A, each two-sided electrode 600 includes a current collector 2 with energy storage media 1 disposed on either side thereof.

Some embodiments of electrodes include five main components. The components include an aluminum current collector 2, a polymer primer layer which is provided to promote adhesion of energy storage media 1 (also referred to as "active material"), and a three-component active material. The active material may include, for example, activated carbon (to enhance capacitance), carbon black (to provide high conductivity and reduce equivalent series resistance (ESR)), and a polymer binder (to hold the powders together).

In some embodiments, carbon nanotubes (CNTs) are used as an alternative material to provide for the adhesive and the cohesive matrix. That is, the primer may be replaced by a CNT adhesion layer (AL), and the polymer binder for the active material may also be replaced by CNTs. The CNTs may also reduce or replace the carbon black as a conductive aid. The resulting electrodes (i.e., electrodes that do not include a polymer or other adhesive material) are "binder-free." Such binder free electrodes may advantageously operate at extreme conditions (e.g., high voltage and/or temperature) without degradation due to electrochemical reactions between a binder and surrounding material (e.g., electrolyte). Not wishing to be bound by theory, in some embodiments it is understood that electrostatic attraction (e.g., Van der Waal's bonds) between the carbons in the binder free electrode provide sufficient adhesion and cohesion to maintain the integrity of the electrode even under harsh conditions. For example, in some embodiments the binder free electrode may exhibit little or no deleterious delamination even when subjected to reflow processes (as detailed herein) or when subjected to operating voltages of at least 2.0 V, or at least 2.1 V or more at operating temperatures of 65° C., 85° C., 100° C., 125° C., 150° C., or more.

In some embodiments of binder free electrodes, the active media includes activated carbon (or other types of carbonaceous material) bound together by a matrix of carbon nanotubes (CNT), and the active layer is a matrix of carbon nanotubes (CNT) without any other fillers. Advantageously, (e.g. to reduce manufacturing cost) in some embodiments the concentration by weight of CNTs in the active layer may be relatively low, e.g., less than 50%, 40%, 30%, 20%, 10%, 7.5%, 5.0%, 2.5% or less depending on the desired performance characteristics of the electrode.

In some embodiments, the matrix is achieved by dispersing active carbon powder and/or a powder that includes carbon nanotubes (CNT) in isopropyl alcohol using ultrasonication and sufficient energy to de-bundle the carbon nanotubes (CNT) from each other. A successful dispersion may be characterized by material separation and appearance. For example, whether the carbon nanotube (CNT) material separates from the solvent and whether a smooth film appears when dried.

Cohesive and adhesive strength of the active media and active layer respectively are both influenced by the dispersion quality of the carbon nanotubes (CNT) in their slurries (as well as characteristics of the carbon nanotube (CNT), drying time, layer thickness, substrate material, substrate texture, etc.). The dispersion of the carbon nanotubes (CNT) is influenced by the choice of solvent (and carbon nanotube (CNT) characteristics; concentration; material purity; surfactant use; batch size; dispersion settings, e.g. sonicator amplitude, duty cycle, temperature, probe depth, stirring quality; etc.).

Adhesion of the active media to the current collector 2 may be improved by addition of an adhesion layer (AL) of carbon nanotube (CNT) s to the current collector 2. This may be done by casting and drying a layer of active media on a stainless steel (SS) plate, compressing a different plate with vertically aligned carbon nanotubes against an aluminum carbide coated current collector 2 using a roll-to-roll machine to transfer the carbon nanotubes (CNT), and then pressing the plate with active media against the current collector 2/carbon nanotube (CNT) layer to form an electrode.

In some embodiments, production of the electrode is accomplished by casting a thin layer of carbon nanotube (CNT) slurry directly onto the current collector 2, letting the thin layer dry, then casting the active media slurry on top.

Several techniques may be employed to place all the layers of active media onto the electrode. In one embodiment involving calendaring, casting and drying a layer of active media on a stainless steel (SS) plate is performed, then compressing a different plate with vertically aligned carbon nanotubes (VACNTs) against an aluminum carbide coated current collector 2 to transfer the vertically aligned carbon nanotubes (VACNTs), and then pressing the plate with the active media against the aluminum carbide coated current collector 2 hosting the vertically aligned carbon nanotubes (VACNTs) layer to form an electrode. In another embodiment, a thin layer of carbon nanotubes (CNT) is cast as a slurry directly onto the current collector 2, dried, and then the active media is cast as a slurry on top of the thin layer of carbon nanotubes (CNT).

Selection of activated carbon includes evaluation of capacitance versus lifetime. That is, it has been found that there is often a trade-off between the highest capacitance materials and the longest lifetime materials. Generally, it was found that the quality of activated carbon should be empirically determined. It was found that with regard to active material carbon nanotube (CNT) powder selection: longer carbon nanotube (CNT) result in a stronger matrix; a lower wall count in the carbon nanotubes (CNT) is better in terms of density efficiency; high purity of carbon nanotube (CNT) avoids reactive content; pores can oxidize to expose the interior surface of the carbon nanotube (CNT), but may result in addition of impurities. With regard to adhesion layer powder selection, it was found that: for length, cohesion versus adhesion should be evaluated as carbon nanotubes (CNT) that are too long will self-adhere too well and peel off the current collector 2; and a thinner layer of CNT mitigates the risk of peeling off the current collector 2. With regard to calendering techniques: the carbon nanotube (CNT) matrix may be "activated" with pressure, becoming less powdery after the CNT have been stuck together, higher pressure gets better density, but there are diminishing returns; starting the calendaring process with low pressure and working up with addition passes seems to help adhere the layers in some cases. Care should be taken to avoid overworking as this can lead to delamination. More calendaring passes can increase density slightly, but the risk of overworking or wrinkling the current collector 2 will increase.

The adhesion layer may include carbon nanotubes (CNT), carbon nanofibers, metallic nanowires, and ceramic nanofibers. For active material cohesion carbon nanotubes (CNT) may be used, as well as carbon nanofibers, metallic nanowires, and/or ceramic nanofibers. For active material energy storage: activated carbon may be used, and/or carbon black, additional carbon nanotubes (CNT), soot, jet black, buckeyballs, fullerenes, graphite, graphene, nanohorns, nanoonions, as well as other forms of carbon. Carbon nanotubes (CNT) used could be single-walled, double-walled, multi-walled, of any length, diameter, purity, crystallinity, or other aspect as deemed appropriate.

In various embodiments, dimensions of the electrode range between about 20 μm up to about 350 μm. In various embodiments, at thickness of the current collector is in a range of between about 10 μm to about 50 μm. In various embodiments, a thickness of the adhesion layer is between about 2 μm to about 10 μm or more. A thickness of the active material disposed onto the adhesion layer may be between about 5 μm to about 150 μm or more. In some embodiments, the carbon nanotubes (CNT) used in the adhesion layer are between 1 nm to about 200 nm diameter, about 1 μm to about 1000 μm in length, and have a wall count that is between about 1 to 100. In some embodiments, the carbon nanotubes (CNT) used in the active material are between 1 nm to about 200 nm diameter, about 1 μm to about 1000 μm in length, and have a wall count that is between about 1 to 100. In some embodiments, the active material includes roughly spherical particles, exhibiting a diameter of between about 2 μm and about 30 μm.

In some embodiments, compression of the energy storage media is applied after drying. Generally, this helps lock the carbon nanotubes (CNTs) in place. A roll press, hydraulic press, or other type of press may be used. Care should be taken to avoid damage of the current collector.

In various embodiments, the electrode layers may be formed using any of the techniques descried in International Patent Publication No. WO/2018/102652 published Jun. 7, 2018, the entire contents of which are incorporated herein by reference.

Figure 4B:
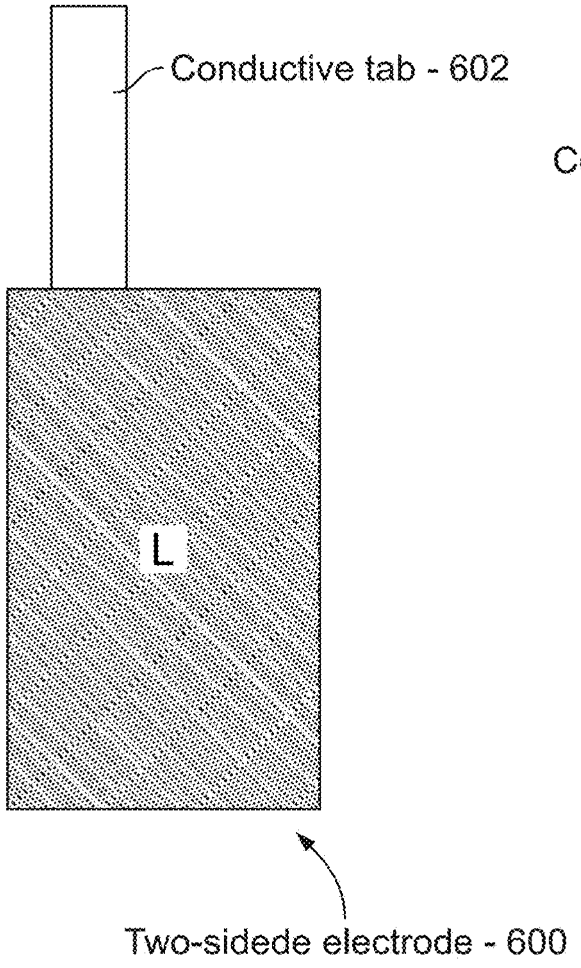
Figure 4C:
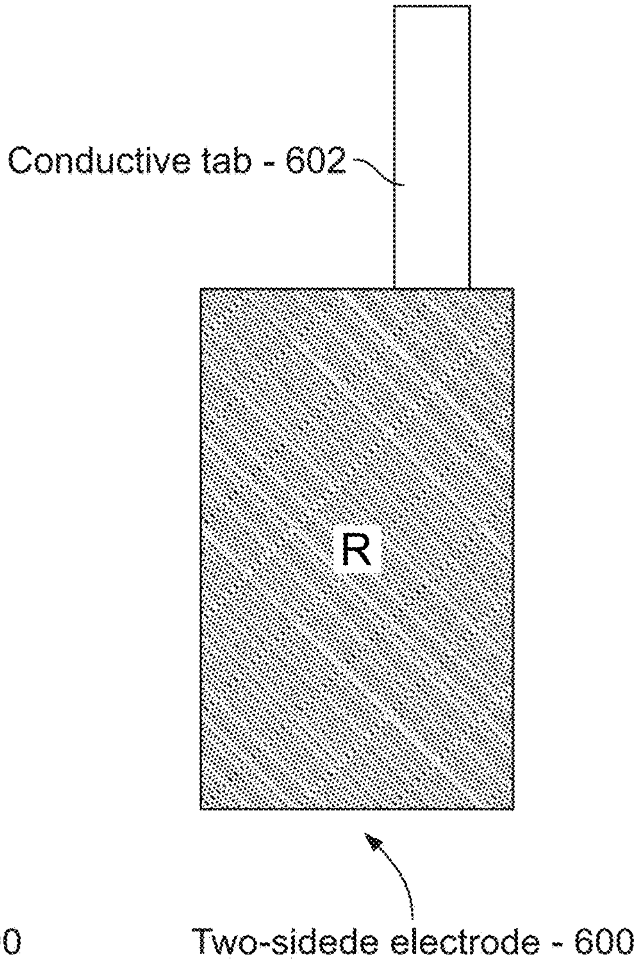

In order to provide for current collection from a group of positive electrodes and from negative electrodes, a plurality of left-handed (FIG. 4B) and right-handed (FIG. 4C) two-sided electrodes 600 are produced. Generally, each of the left-handed or right-handed two-sided electrodes 600 include the energy storage media 1 disposed on either side thereof and include a conductive tab 602 which is substantially free of energy storage media 1.

Electrodes may be punched from the sheet of material using a suitable press. The electrodes punched from the sheet of material exhibit appropriate dimensions for use in the storage cell 105. Once the dimensional electrodes have been cut, they may be prepared. Preparation of the dimensional electrode may include, for example: calendaring each electrode in order to assure retention of the energy storage media 1; trimming of edges; and a heat treatment to encourage migration and reduction of any impurities. After preparation, the electrodes may be transferred to a suitable environment in preparation for assembly.

Once fabricated and qualified for use, the two-sided electrodes 600 are included in a stack assembly. In order to proceed with assembly of the stack, an appropriate separator 5 is provided. The separator 5 may be fabricated from separator material.

In some embodiments, the separator 5 is cut from a supply of separator material which, in one embodiment, is a supply of polytetrafluoroethylene (PTFE). PTFE is a synthetic fluoropolymer of tetrafluoroethylene (commonly referred to as TEFLON, available from Chemours of Delaware). PTFE is a fluorocarbon solid, as it is a high-molecular-weight compound consisting wholly of carbon and fluorine. In the exemplary embodiment, the separator 5 is 25 μm thick. An example of an active stack assembly with a single separator 5 is illustrated in FIGS. 5A and 5B.

Figure 5A:
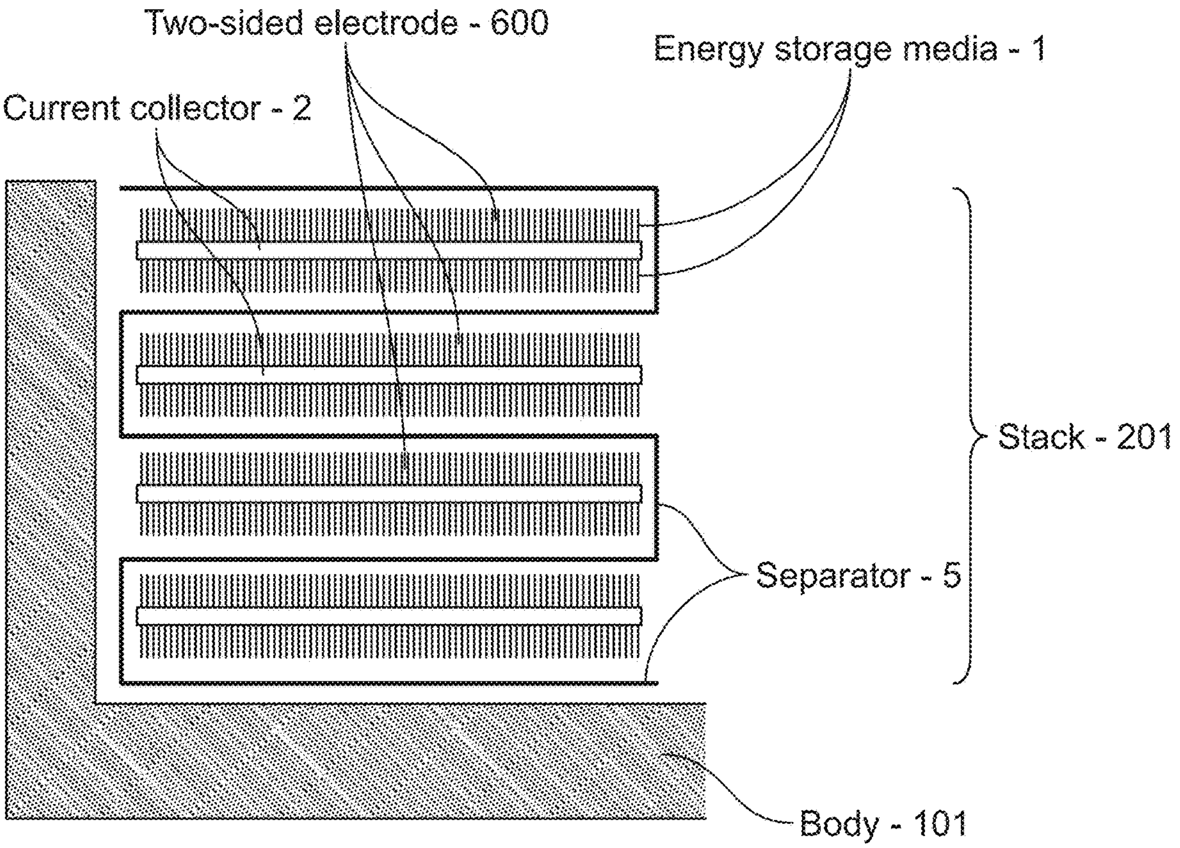
FIG. 5A is a depiction of an embodiment of energy storage media for use within a storage cell for the chip cap of FIG. 2.
Figure 5B:
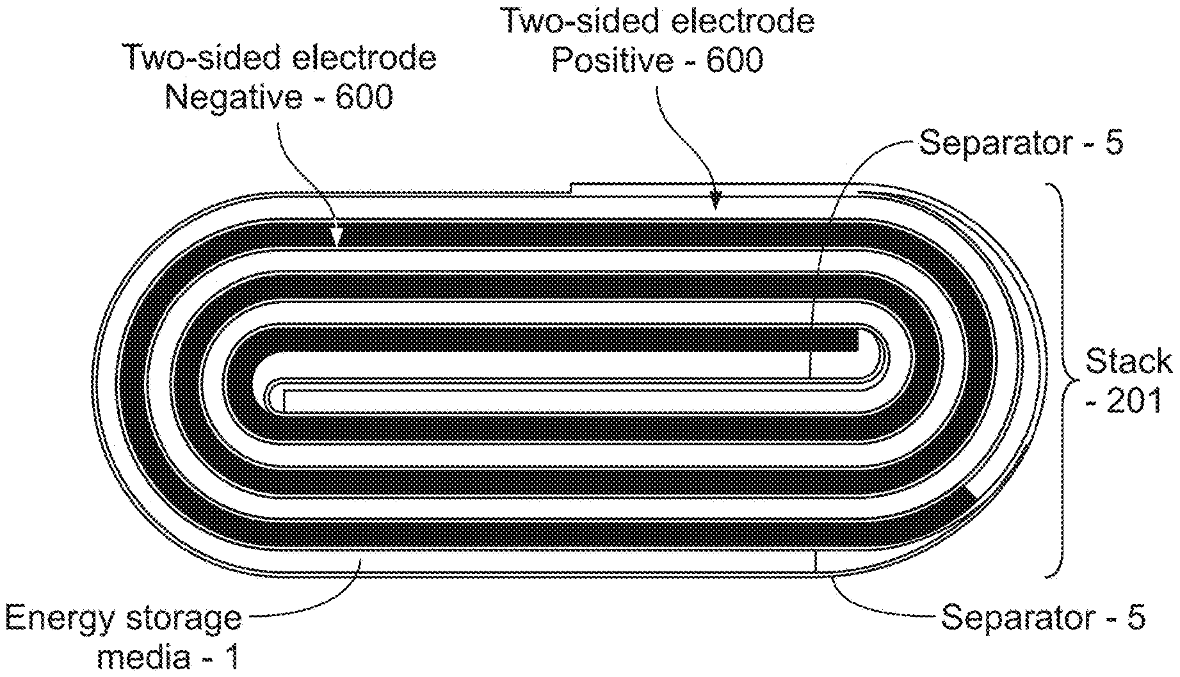
FIG. 5B is an end view of another embodiment of energy storage media for use within a storage cell for the chip cap of FIG. 2.

FIG. 5A depicts conceptual aspects of a "z-fold" arrangement of energy storage media 1. In the z-fold embodiment, layers of the separator 5 are formed from a single piece of separator material folded in a z-fold fashion. The z-folded separator 5 includes opposing positive electrodes 4 and negative electrodes 3 and associated current collectors 2 folded therein. Generally, as referred to herein, an assembly of multiple layers of the electrodes, current collectors and separators is referred to as a "stack 201," and may also be referred to as an "active stack" and by other similar terms.

In order to fabricate a z-fold stack 201, and once the separator 5 has been cut, a first one of the two-sided electrodes 600 is disposed onto an end of the separator 5. The separator 5 is then folded and an opposing two-sided electrode 600 is disposed onto the separator 5. The process continues until a completed stack 201 is provided. In one embodiment, the completed stack 201 includes fifteen two-sided electrodes 600. In this example, the completed stack 201 will have eight (8) layers of electrode on the negative side and seven (7) layers of electrode on the positive side. In this embodiment, each two-sided electrode 600 has an area of energy storage material 1 that is approximately 6 mm by 8 mm. The exposed portion of the current collector 2 that functions as an integrated tab has dimensions that are approximately 1.5 mm by 8 mm.

Generally, the stack 201 is configured to provide a desired level of electrical performance. It is not required nor necessary that the stack 201 be provided in a z-fold arrangement. In some embodiments, each layer of the stack 201 is separated by an individual separator 5. In some embodiments, each layer of the stack 201 may be contained within an envelope of (i.e., surrounded by) separator material.

Similarly, the entire storage cell 105 may be provided in an envelope of separator material or other suitable protective barrier (e.g., an electrically insulating thermoplastic or other suitable material). In some embodiments, this envelope may contain the electrolyte wetting the stack 201, preventing the electrolyte from coming in contact with elements external to the barrier. In some such embodiments, conductive tabs 602 may extend out through the envelope to provide electrical communication between the stack 201 and the leads (123, 124). Alternatively, in some embodiments, the leads (123, 124) may extend through the envelope for connection to the tabs 602. In general, the envelope may be sealed around such electrical connections (e.g., heat sealed) to prevent leakage of electrolyte out of the envelope.

In various embodiments, the storage cell 105 may be constructed using any of the techniques described in International Patent Publication No. WO2015102716A8 published Nov. 26, 2015 or International Patent Publication No. WO2016057983A3 published Jun. 30, 3016, the entire contents of each which are incorporated herein by reference.

In some embodiments, the stack 201 is constructed by cutting (e.g., using a blade or a cutting laser) or punching out electrode layers from a sheet of electrode material. The electrode material may include a sheet of material suited for use as the current collector 2 with energy storage material 1 disposed on either side. Alternating layers within the stack 201 make up the negative electrodes and the positive electrodes. Separator material is interleaved between each layer and wrapped around the final assembly to form the completed stack 201.

Figure 6A:
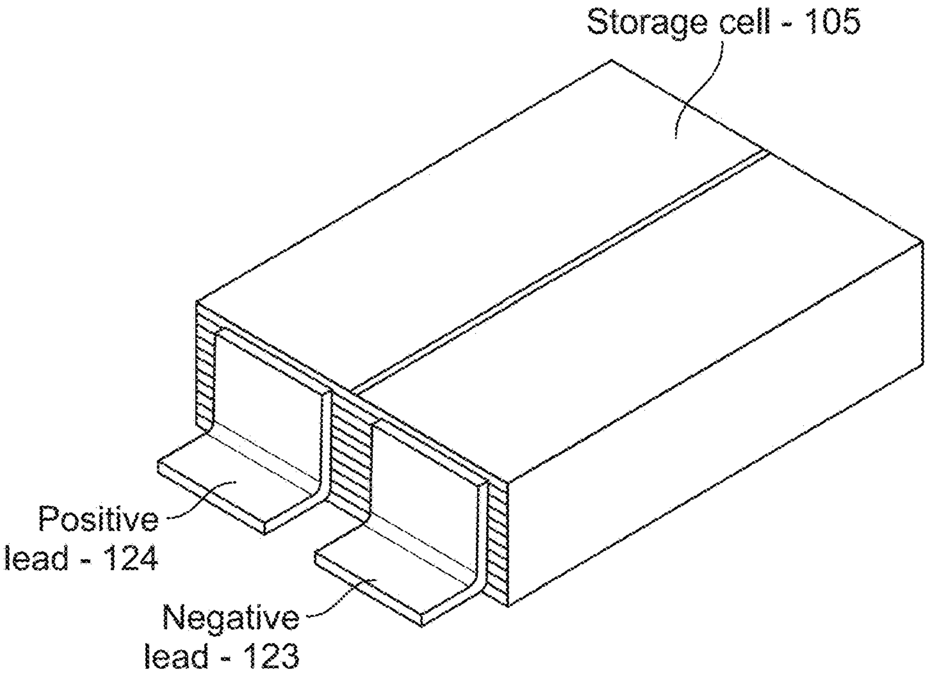
FIG. 6A is an isomeric view depicting the storage cell resulting from the embodiment of FIG. 5A.

As the stack 201 contains multiple layers of electrodes, multiple conductive tabs 602 are present. The multiple conductive tabs 602 extend beyond the energy storage media 1 and provide for making electrical contact. In the stack 201, the conductive tabs 602 are grouped according to polarity and formed into a single negative lead 123 and a single positive lead 124. Collectively, the assemblage of the stack 201 with the negative lead 123 and positive lead 124 provide for the storage cell 105. An illustration of the storage cell 105 in an assembled form is provided in FIG. 6A. The embodiment depicted in FIG. 6A makes use of the z-fold technology discussed with regard to FIG. 5A.

FIG. 5B depicts another embodiment for arranging energy storage media 1 for use in the storage cell 105. In this "square wound" or "jelly roll" embodiment, continuous strips of two-sided electrodes 600 are wound into a roll form and separated by the separator 5. Physical aspects for one embodiment of a square wound storage cell are presented in Table 1 below.

TABLE 1

| Dimension | Value | Unit |
|---|---|---|
| Separator Thickness | 0.025 | mm |
| Current Collector Thickness | 0.025 | mm |
| Active Layer Thickness | 0.062 | mm |
| Mandrel Thickness | 0.002 - top<br>0.007 - bottom | in |
| Mandrel Width | 3.75 | mm |
| Positive Electrode Length | 31 | mm |
| Negative Electrode Length | 35.5 | mm |
| Separator Length | 120 | mm |
| Number of Winds | 3.5 | |
| Jellyroll Thickness | 2.337 | mm |
| Minimum Bend Radius | 0.214 | mm |

In some embodiments, the storage cell 105 may be compressed, at least partially, once assembled. Compression may be used, for example, to ensure the storage cell 105 conforms to dimensional requirements of the housing or package into which it will be disposed.

Exemplary aspects of winding the jelly roll embodiment are presented further herein. Reference may be made to FIGS. 21 through 25.

In some embodiments, grouping of the conductive tabs 602 into a respective one of the single negative lead 123 and a single positive lead 124 is performed by pre-bending of the conductive leads prior to assembly of the storage cell 105. When the storage cell 105 is disposed within the body 101, the group of conductive tabs 602 is welded to a respective pad 110 (FIG. 7), thus forming a unitary lead (123, 124). Welding may be accomplished by, for example, ultrasonic welding or laser welding.

Figure 7:
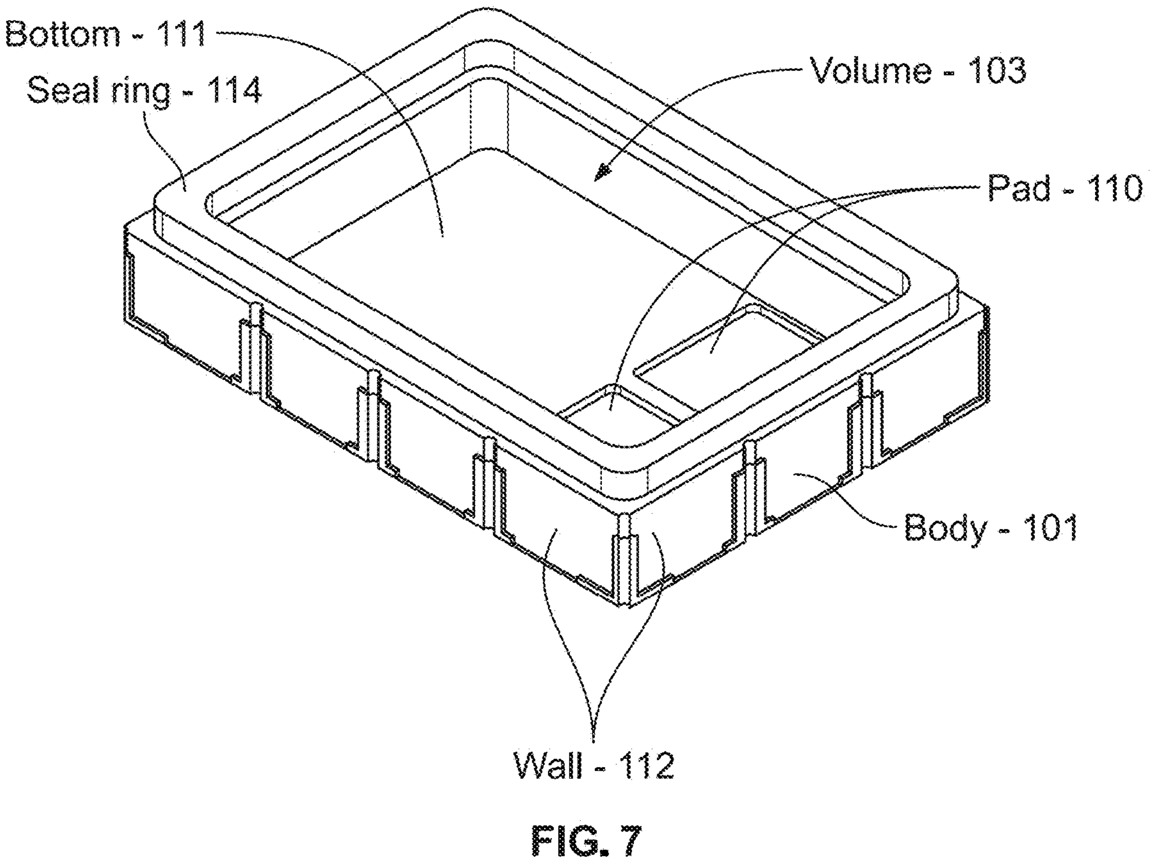
FIG. 7 an isometric view depicting a body for the chip cap of FIG. 2.

FIG. 7 depicts aspects of the body 101. The body 101 of the chip cap 100 may be fabricated from dielectric material, such as various forms of ceramic material. Included within the body 101 are electrical pads 110 which provide for conducting electrical current from the storage cell 105 once disposed therein. The electrical pads 110 may also conduct electrical current to the storage cell 105 in order to recharge the chip cap 100.

In the illustration of FIG. 7, the body 101 generally includes a bottom 111 and four walls 112 running about a perimeter of the bottom 111. Thus, the body 101 provides a container into which the storage cell 105 may be disposed. An underside of this example of the body 101 is shown in FIG. 8.

Figure 8:
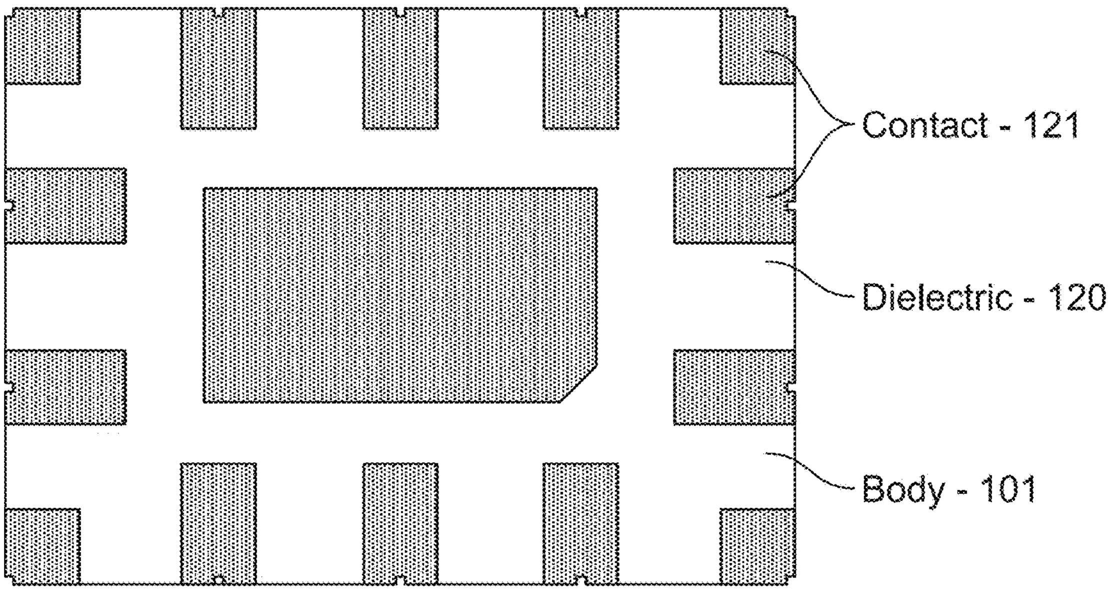
FIG. 8 is a bottom view of the body of FIG. 7.

As shown in FIG. 8, the underside of the bottom 111 of the body 101 includes electrical contacts 121 separated by the dielectric material 120. At least some of the contacts 121 are in electrical communication with the electrical pads 110 and enable communication of energy from the chip cap storage cell 105 to a circuit board upon which the chip cap 100 may be mounted. Generally, the energy is communicated from the electrical pads 110 to the contacts 121 through electrical conductors or vias (not shown) that are contained within the body 101 and surrounded by the dielectric material 121. For example, in some embodiments, the body may contain one or more conductive slabs (e.g., embedded within the bottom 110 of the body 101) establishing electrical communication between the electrical pads 110 and the contacts 121. These slabs may be made of, for example, tungsten or other suitable conductive materials.

Accordingly, for each of the two-sided electrodes 600, a conductive path is formed from the current collector 2, through the conductive tab 602, through a respective lead (123, 124) to a respective electrical pad 110, and then from the electrical pad 110 through conductive vias within the body 101 to one or more contacts 121 on the bottom surface of the body 101.

The interior electrical pads 110 are exposed to the volume 103 (also referred to here in as a "cavity") within the body 101. The lid 102 may include compatible material, such as ceramic or metallic material. During assembly of the chip cap 100, the lid 102 is hermetically sealed to the body 101 by being sealed to seal ring 114. The resulting hermetic seal exhibits environmental integrity by preventing environmental intrusion into the chip cap 100 as well as leakage of electrolyte from the chip cap 100. The hermetic seal includes any type of seal that makes the chip cap 100 substantially airtight (excludes the passage of electrolyte, air, oxygen, or other gaseous form of materials) to ensure adequate performance for an intended service interval.

Examples of devices suited for use as the body 101 include those devices in the Surface Mount Device (SMD) product line commercially available from NTK Technologies of Nagoya, Japan. Other examples are available from Schott AG of Landshut, Germany and Adtech Ceramics Company of Chattanooga, Tennessee.

In some embodiments, the body 101 is a high temperature co-fired ceramic device. Generally, co-fired ceramic devices are monolithic, ceramic microelectronic devices where the entire ceramic support structure and any conductive, resistive, and dielectric materials are fired in a kiln at the same time.

Typically, co-fired ceramic devices are made by processing a number of layers independently and assembling them into a device as a final step. Co-firing can be divided into low temperature (LTCC) and high temperature (HTCC) applications: low temperature devices are fabricated with the sintering temperature is below 1,000 degrees Celsius (1,830 degrees Fahrenheit), while high temperature is around 1,600 degrees Celsius (2,910 degrees Fahrenheit). Compared to LTCC, HTCC has higher resistance conductive layers.

HTCC packages generally include multiple layers of alumina oxide ($Al_2O_3$) with tungsten (W) and molymanganese (MoMn) metallization. The advantages of HTCC includes mechanical rigidity and hermeticity, both of which are important in high-reliability and environmentally stressful applications. Another advantage of HTCC technology is thermal dissipation capabilities.

Typical ceramic packages use an alumina ceramic ($Al_2O_3$) of which there are varying purity and compositions to support different applications. A typical ceramic package may be composed of 90-94 percent alumina, with the remaining portion composed of alkaline-earth silicates or other binding materials, such as magnesia (MgO) or silica (SiO2), for controlling grain size and bonding the alumina together.

The body 101 may be provided as a multi-layer ceramic package that has a metallization layer that carries power from the storage cell 105 through to the external contacts 121. This metallization layer can be made from tungsten (W) or molymanganese (MoMn) in the case of High Temperature Cofired Ceramics (HTCC), or gold (Au) or copper (Cu) in the case of Low Temperature Cofired Ceramics (LTCC).

Typically, a plating process is performed over the metallization layer to protect the metallization layer from oxidation. Additional plating is not necessary if a metallization process such as a gold (Au) metallization process used in LTCC is employed. Commonly, a plating layer includes nickel (Ni) as a base followed by a thin (–0.3 μm) layer of gold (Au) for oxidation protection. Alternative plating metals include titanium (Ti) and palladium (Pd). The selected combination of plating metals may be with regard to forming strong and reliable wire bonds.

Notably, when the storage cell 105 is placed within the body 101 (FIG. 9), elements of the stack 201 (i.e., the current collectors 2 and the energy storage media 1) may be separated from the body 101 (and/or lid 102) by a layer of separator material. This embodiment, referred to as an "isolated stack," results in substantial protection from potential failure due to short circuiting of the storage cell 105. In some embodiments, an isolated stack is achieved by providing the storage cell 105 in an electrically insulating envelope, such as an envelope fabricated from separator material. Once the storage cell 105 has been fabricated, it may be set aside for subsequent installation into the body 101.

The body 101 may be fabricated according to desired specifications (such as dimensions, electrical design, environmental qualification and the like). At least one pocket or well may be added to confine sealant to an area surrounding the electrical pads 110.

Figure 10:
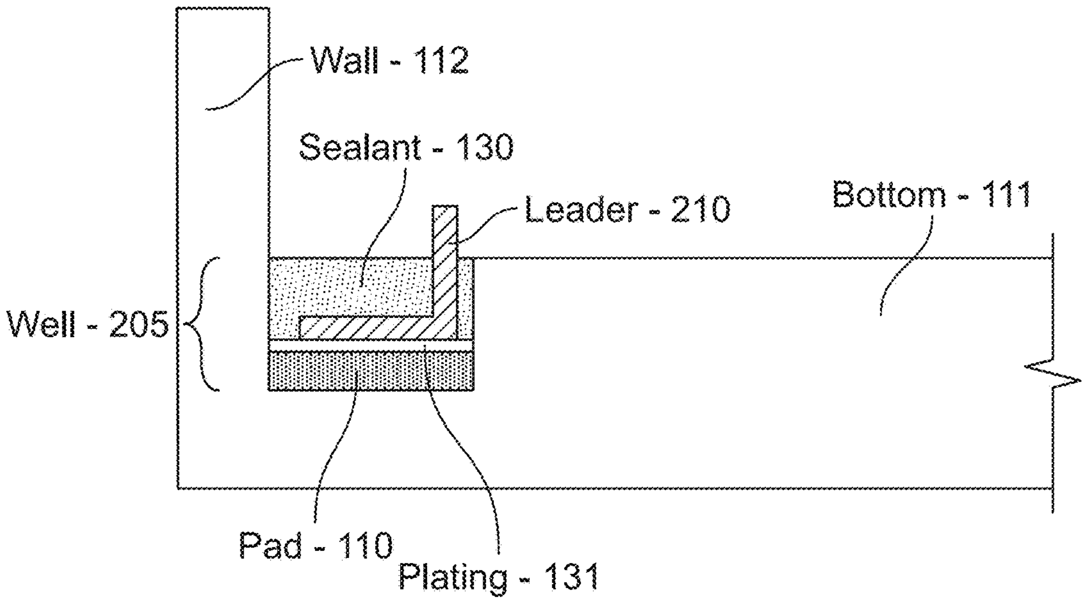
FIG. 10 is a partial schematic view of a cross-section of the body of FIG. 7 in a state of preparation for incorporation of the storage cell.

As shown in FIG. 10, in some embodiments, the electrical pads 110 are disposed within respective wells 205. Each of the wells 205 represents a depression within a top surface of the bottom 111. Generally, the space provided by each well 205 may be used to fold away a portion of the respective leads (123, 124), thus maximizing the volume available for the stack 201. Note that the term "wells" may be used interchangeably with other terms such as "recessed portion", "recesses," "pockets," and other similar terms.

Each electrical pad 110 may be a homogeneous material. For example, the electrical pad 110 may be one of tungsten (W), aluminum (Al), gold (Au), or another conductive material. In some embodiments, the electrical pad 110 is plated with optional plating material. A plating layer, or simply plating 131, may include, for example, gold (Au), nickel (Ni) or copper (Cu). In some further embodiments, the electrical pad 110 is layered. For example, the electrical pad 110 may contain an underlying layer of tungsten (W) with an overlayer of nickel (Ni). The overlayer of nickel (Ni) in turn, having gold (Au) plating 131.

Generally, the materials used in the electrical pad 110 and any plating 131 are selected as a balance of conductivity and low reactance with the selected electrolyte 126. Limiting interaction of the electrolyte is further achieved by suitable preparation of the body 101 and joining of the leads (123, 124). At least one sealant may be used as a part of the preparation and joining.

Gold (Au), nickel (Ni), and tungsten (W) can experience corrosion in the presence of common electrolytes, particularly when under a voltage potential. The resulting corrosion at the plating or metallization layer will cause premature degradation of the electrolyte and weld joint decreasing performance of the chip cap 100. Accordingly, a non-reactive sealant may be used to prevent contact between the plating/metallization layers with the electrolyte. As discussed herein the term "non-reactive" generally refers to a substance that exhibits a level of reactivity that is considered to provide a comparative performance improvement.

For each of the electrical pads 110, a conductive leader 210 may be joined to the electrical pad 110. The joining may be by welding, for example. Welding may be laser welding, ultrasonic welding, or resistance welding. In some other embodiments, conductive epoxies may be used to join the conductive tab 210 with the electrical pad 110. In some embodiments, the conductive leader 210 is formed from aluminum (Al). The configuration of the conductive leader 210 can vary depending on, for example, position of a respective electrode and construction of the body 101.

In one embodiment, the conductive leader 210 is one of the leads (123, 124) for the electrode stack 201. In these embodiments, it may be such that only the weld is required to join the electrode stack 201 to the body 101. In another embodiment, the conductive leader 210 is an intermediate material that is initially separate from the respective lead (123, 124) and the electrical pad 110. The conductive leader 210 is then joined to the respective lead (123, 124) after sealant is applied.

Once the conductive tab 210 has been joined to the electrical pad 110, sealant may be flowed onto the area surrounding the pad 110 and the area around the conductive tab 210. The sealant is then cured. The curing method may involve use of heat, ultraviolet radiation, water/oxygen, evaporation or by other techniques for curing appropriate sealant materials.

In various embodiments, other sealant techniques may be used. For example, in some embodiments, a conformal layer of sealant may be deposited on desired portions of the package. Generally, the conformal layer includes a thin film which "conforms" to the contours of the body 101 to address any imperfections and limit permeability thereof. The conformal layer may be provided as a high viscosity component that flows easily.

Generally, for any conformal coating method used to passivate the internal electrical pads 110, care is taken to keep the conformal coating from also covering external features, seal ring, and other features as appropriate. In some embodiments, material selected for the conformal coating does not interfere with a joining process (such as welding).

In one embodiment, the conformal coating includes a high-temperature thermoplastic polyimide. The high-temperature thermoplastic polyimide may be provided as a material dispensable through a syringe, exhibiting a viscosity slightly higher than water. The resulting insulating layer of material may be between about 3-20 μm thick exhibit strong bonds with ceramic, aluminum, gold, silicone and other materials. In some embodiments, the high-temperature thermoplastic polyimide may include silver or other metallic flakes to make the material conductive. In one embodiment, the high-temperature thermoplastic polyimide is stored at about minus 40 degrees Celsius, worked at ambient temperatures, and subjected to about a cure cycle of about 10 minutes at about 150 degrees Celsius. The cure cycle will cause the high-temperature thermoplastic polyimide to crystallize and release most of excess materials (NMP and $H_2O$) in a gaseous form. An additional heating cycle of about two minutes and about 250 degrees Celsius may be undertaken to remove excess material. The process results in a conformal coating with high insulation properties and very low thermal expansion.

An example of a suitable material is available from MATERION of Buffalo, NY and marketed as BONDFLOW. BONDFLOW includes RM 1-methyl-2-pyrrolidone (CAS 872-50-4).

Once the stack 201 is disposed into the body 101 and electrically connected to the electrical pads 110, electrolyte 126 is added to the remaining volume 103 within the body 101.

In some embodiments, the electrolyte 126 is a combination of an ionic liquid, an ionic salt and a solvent. Generally, the ionic liquid and the solvent are mixed together in order achieve a mixture. The mixture may be entirely ionic liquid with no solvent. In some embodiments, the electrolyte is about twenty percent ionic liquid and eighty percent solvent (by volume). Mixtures of in sub-ranges may be used.

Generally, the ionic salt may be added to the ionic liquid as an additional source of ionic storage, with different cation and anion sizes provided to increase efficiency in view of the surface area provided by the electrode. The ionic salt may be added to the mixture in ranges from about 0 M to 2 M (Molar, or Moles salt/Liter solution).

Subsequently, the body 101 and storage cell 105 installed therein may be weighed and then filled with an appropriate quantity of the electrolyte. The filling may occur, for example, by use of a micro-pipette. Once filled, the body 101/storage cell 105 combination may be placed into a low pressure environment (i.e., under a vacuum). The low pressure encourages migration of the electrolyte 126 into the storage cell 105. Subsequently, the assembly may be weighed again to ensure an adequate supply of electrolyte 126. If the combined body 101, storage cell 105 and electrolyte assembly is within the desired parameters, then the assembly is sent for welding of the lid 102. The lid 102 may then be welded to the body 101. Welding may be accomplished in an inert environment using, for example, a seam welder.

In various embodiments, care is taken to avoid unwanted impurities within the volume 103 containing the storage cell 105. In some embodiments, within the cavity of the housing body containing the energy storage cell a total concentration of halide ions is kept to below about 1,000 ppm, 500 ppm, 200 ppm, 100 ppm or less. In some embodiments, within the cavity of the housing body containing the energy storage cell metallic species impurities are kept to below about 1,000 ppm, 500 ppm, 200 ppm, 100 ppm or less. In some embodiments, within the cavity of the housing body containing the energy storage cell impurities of bromoethane, chloroethane, 1-bromobutane, 1-chlorobutane, 1-methylimidazole, ethyl acetate, and methylene chloride are kept to below about 1,000 ppm, 500 ppm, 200 ppm, 100 ppm or less. In some embodiments, within the cavity of the housing body containing the energy storage cell moisture is kept to below about 1,000 ppm, 500 ppm, 200 ppm, 100 ppm, 50 ppm, 10 ppm or less. In some embodiments, within the cavity of the housing body containing the energy storage cell halide impurities are kept to below about 1,000 ppm, 500 ppm, 200 ppm, 100 ppm, 50 ppm, 10 ppm or less.

In various embodiments, the electrolyte may be any of the types described International Patent Publication WO2015102716A8 published Nov. 26, 2015 and International Publication No. WO2016204820A2 published Dec. 22, 2016 the entire contents of each of which are incorporated herein by reference. For example, in some embodiments, the electrolyte may include a gel or solid state electrolyte of the type described in the foregoing references.

Figure 9:
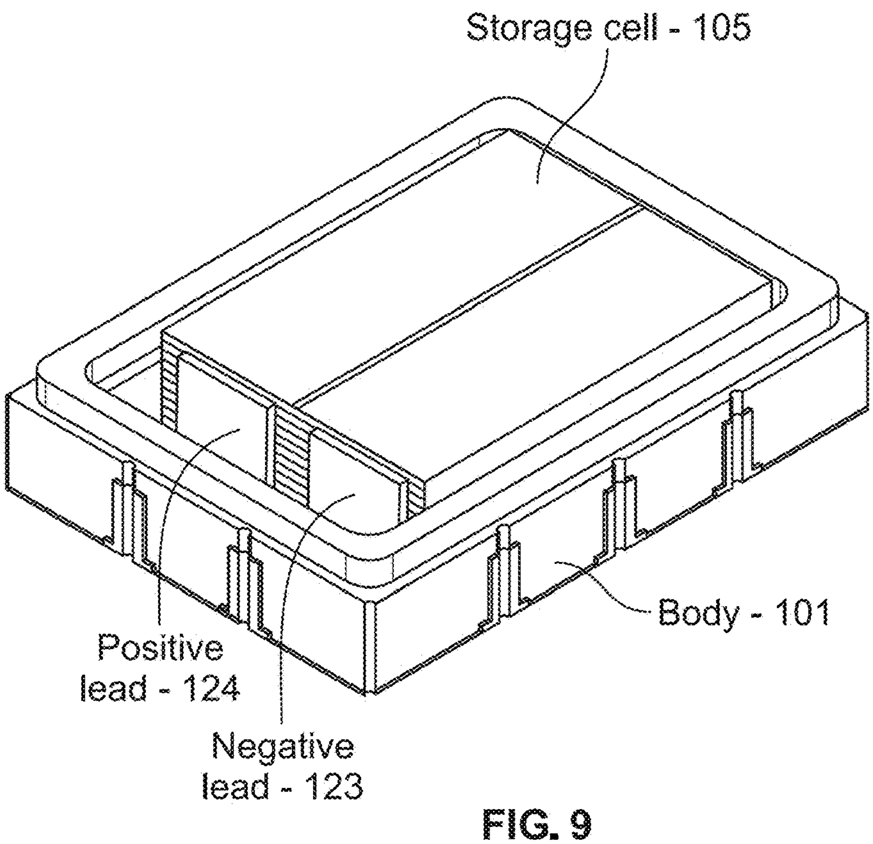
FIG. 9 is an isomeric view depicting the storage cell of FIG. 6 disposed within the body of FIG. 7.
Figure 11:
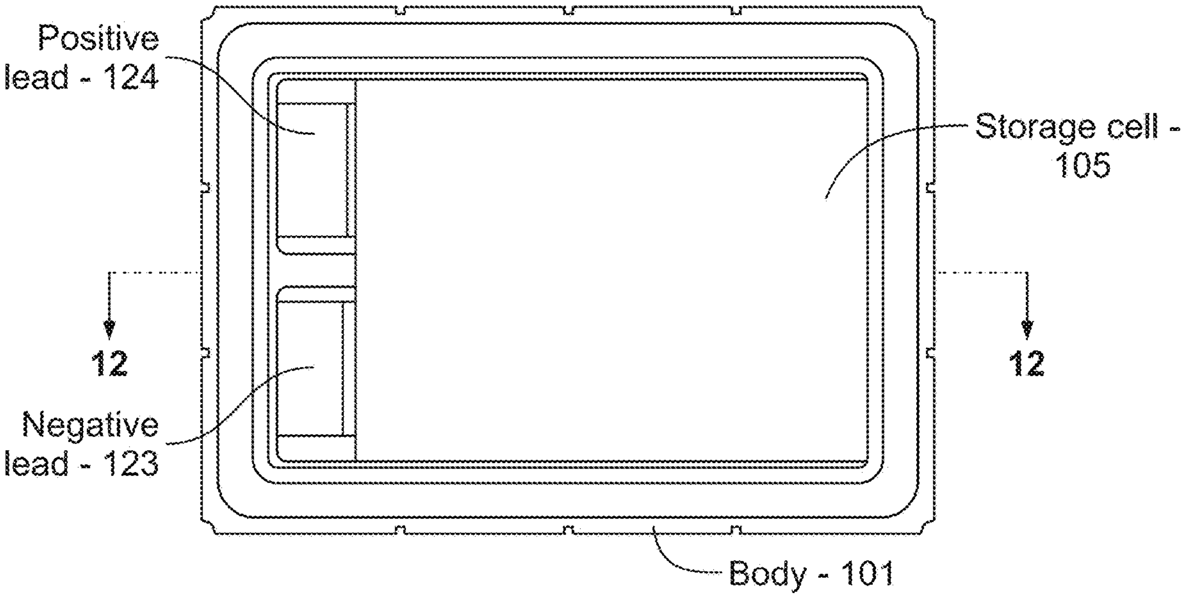
FIG. 11 is a top down view of the assembly of FIG. 9.
Figure 12:
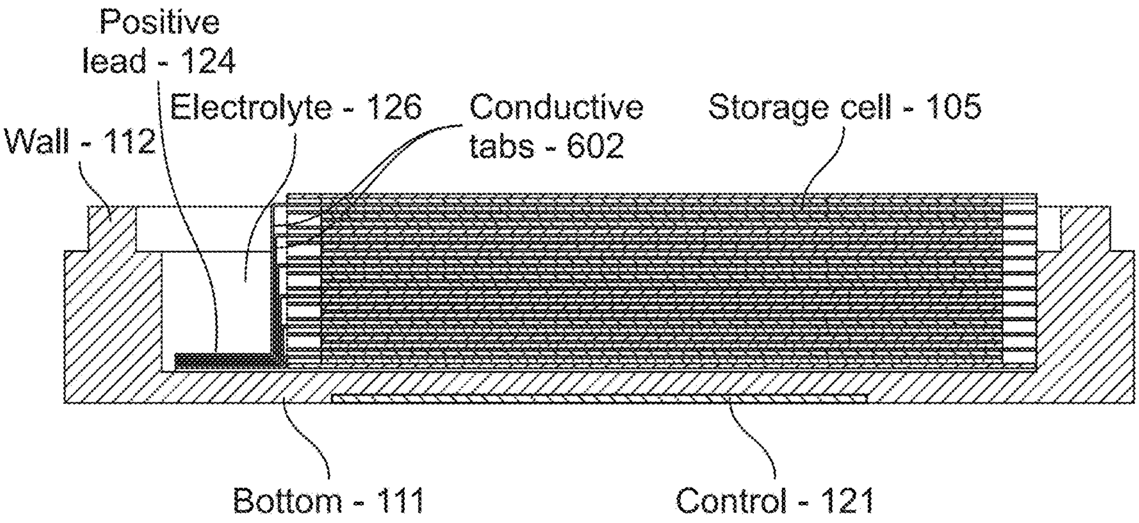
FIG. 12 is a cross-sectional view of the assembly shown in FIG. 11, the cross-section taken along an axis labelled "A"

FIG. 11 provides a top-down view of the assembly of FIG. 9. In FIG. 11, the storage cell 105 and the body 101 are bisected by an imaginary axis-A. FIG. 12 is a cut-away depiction of the storage cell 105 and the body 101.

As shown in FIG. 12, the storage cell 105 includes multiple layers. Emergent from the multiple layers are multiple conductive tabs 602. In this cross-section, the multiple conductive tabs 602 are gathered to collectively provide for the positive lead 123. During assembly, the negative lead 123 is formed into an appropriate shape and joined to a respective one of the electrical pads 110, the same process occurring for the positive lead 124 (not shown in this cross-sectional view). Subsequently, the body 101 is filled with an embodiment of electrolyte 126 suited for the chip cap 100. The electrolyte 126 wets the leads (123, 124), and the contents of the storage cell 105.

In some embodiments, the energy storage cell 105 may be a symmetric EDLC, with equal mass of active material provided on the positive and negative electrodes of the capacitor. However, having equal electrode masses may prevent the EDLC to have the largest possible specific capacitance if the sizes of the anions and cations in the electrolyte differ because the electrodes and the electrolyte may not be completely utilized. In some embodiments this issue can be resolved by mass balancing by adjusting the electrode masses according to the size of the ions, e.g., to increase an EDLC's specific capacitance. In some embodiments, the stack 201 may include an unequal number of positive and negative electrode layers, to provide improved mass balancing.

The resulting chip cap 100 is robust to manufacturing processes that typically destroy competitive devices. One example of such a manufacturing process is that of "reflow." In reflow processes, components are heated to temperatures adequate to cause flow of solder. Generally, efficient volume production of electronic components requires use of reflow processes. Further, compact designs often make use of surface mount devices to limit space used by components and are likewise reliant on reflow processing.

Figure 13:
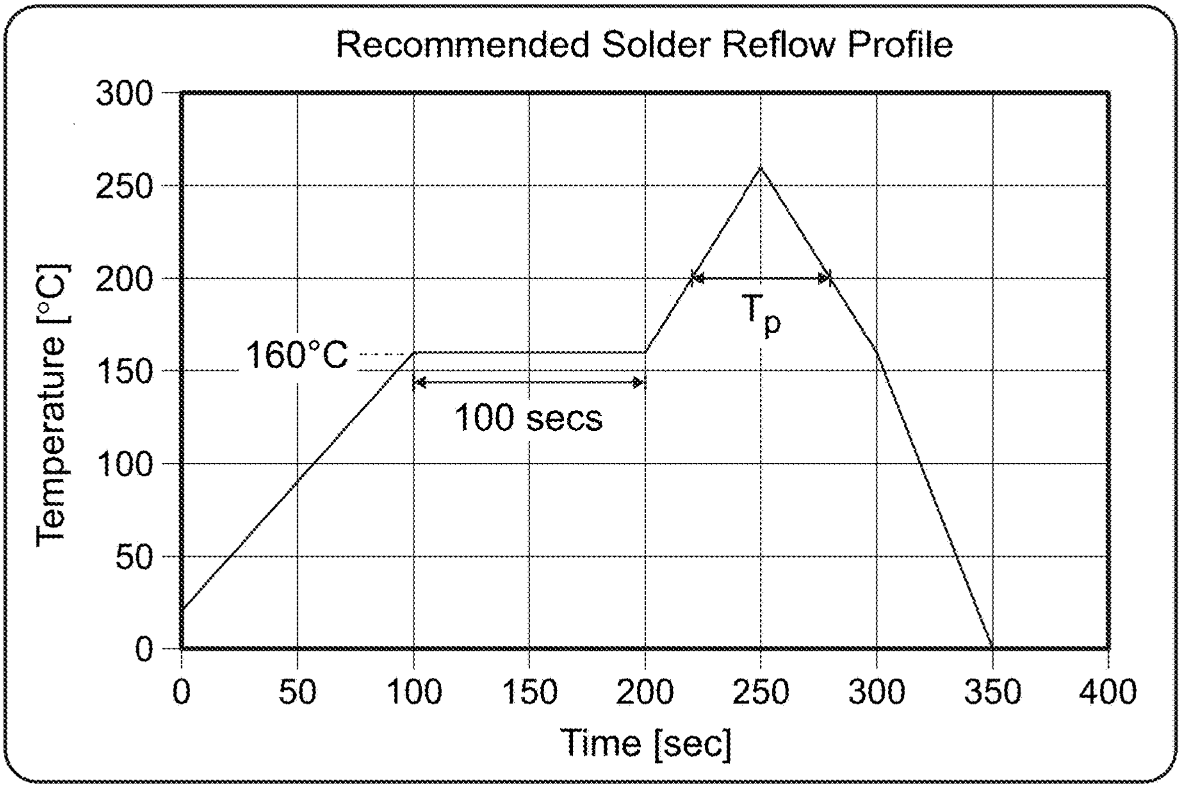
FIG. 13 is a graph depicting a time-temperature profile for reflow of the chip cap of FIG. 2.

In one embodiment, the chip cap 100 is mounted on a printed circuit board according to a recommended solder reflow profile. A graphic depiction of time versus temperature is provided in FIG. 13. In the example of FIG. 13, temperature is increased at three (3) degrees Celsius per second to a preheat stage (referred to as a "soak"). In the preheat stage, the chip cap 100 is maintained at a temperature of between about 150 degrees Celsius to about 160 degrees Celsius for about 100 seconds. The temperature is then increased at three (3) degrees Celsius per second to a reflow temperature (referred to as "reflow"). Reflow temperature may be reached at about 260 degrees Celsius. Generally, the time above 200 degrees Celsius should be less than about 60 seconds, after which the mounted chip cap 100 is cooled at a rate of about 6 degrees Celsius or less.

In some embodiments, the chip cap 100 may exhibit a capacitance degradation of less than 10%, 5%, 2.5% or less in response to one, two, three, four, or more reflow cycle processes. In some embodiments, the chip cap 100 may exhibit an ESR increase of less than 10%, 5%, 2.5% or less in response to one, two, three, four, or more reflow cycle processes. In some embodiments, the reflow process may even advantageously increase the capacitance and/or decrease the ESR of the chip cap, operating essentially as a seasoning process for the device.

Evaluation of the chip cap 100 has demonstrated superior performance. In order to provide some context for the evaluation, some terminology is introduced.

Electrical circuit theory deals with ideal resistors, capacitors and inductors, each assumed to contribute only resistance, capacitance or inductance to the circuit. However, all components have a non-zero value of each of these parameters. In particular, all physical devices are constructed of materials with finite electrical resistance, so that physical components have some resistance in addition to their other properties. The physical origins of ESR depend on the device in question.

In a non-electrolytic capacitor and electrolytic capacitors with solid electrolyte the metallic resistance of the leads and electrodes and losses in the dielectric cause the ESR. Typically quoted values of ESR for ceramic capacitors are between 0.01 and 0.1 ohms. ESR of non-electrolytic capacitors tends to be fairly stable over time; for most purposes real non-electrolytic capacitors can be treated as ideal components.

Aluminium and tantalum electrolytic capacitors with non solid electrolyte have much higher ESR values, up to several ohms. Prior art electrolytic capacitors of higher capacitance have lower ESR. ESR decreases with frequency up to the capacitor's self-resonant frequency. A serious problem, particularly with aluminium electrolytics, is that ESR increases over time with use. ESR can increase enough to cause circuit malfunction and even component damage, although measured capacitance may remain within tolerance. While this happens with normal aging, high temperatures and large ripple current exacerbate the problem. In a circuit with significant ripple current, an increase in ESR will increase heat dissipation, thus accelerating aging.

Electrolytic capacitors rated for high-temperature operation and of higher quality than basic consumer-grade parts are less susceptible to become prematurely unusable due to ESR increase. A cheap electrolytic capacitor may be rated for a life of less than 1000 hours at 85° C. Higher-grade parts are typically rated at a few thousand hours at maximum rated temperature. If ESR is critical, specification of a part with higher temperature rating, "low ESR" or larger capacitance than is otherwise required may be advantageous.

Chip caps of the type herein have demonstrated excellent performance under challenging conditions. In some embodiments, the chip cap may have an operating voltage of at least 2.0 V, 2.1, V, 2.2. V, 2.3 V, 2.4 V, 2.5 V, 3.0 V, or more. In some embodiments, the chip cap may have a capacitance of at least 300 mF, 400 mF, 450 mF, 500 mF or more. In some embodiments, the chip cap may have an energy density of at least 4.0 J/cc, 4.5 J/cc, 5.0 J/cc, 5.1 J/cc, or more. In some embodiments, the chip cap may have a peak power density of at least 15 W/cc, at least 20 W/cc, at least 22 W/cc, or more. In some embodiments, the apparatus may have an equivalent series resistance of 500 mΩ or less, an equivalent series resistance of 400 mΩ or less, an equivalent series resistance of 300 mΩ or less. In some embodiments, the apparatus may have an operating temperature rating of at least 65° C., 75° C., 85° C., 100° C., 125° C., 150° C., or more. In general, the foregoing performance parameters may be achieved using a chip cap containing a single energy storage cell. Extended performance (e.g., higher voltage operation) may be achieved by using multiple chip caps, and/or chip caps which incorporate multiple energy storage cells.

In abuse testing, chip caps of the type described herein may demonstrate an operational lifetime of at least 1,000, at least 1,500, or at least 2,000 hours or more at an operating voltage of at least 2.0 V or 2.1 V, or more (e.g., 2.5 V, 3.0 V or above) and an operating temperature of at least 65° C., 85° C., 100° C. or more while exhibiting a capacitance degradation of less than 30% and an equivalent series resistance increase of less than 100%. In some embodiments, the foregoing operational lifetime may be demonstrated after the apparatus has been soldered to a printed circuit board using a reflow process having at least one, two, three, four, five, six, or more temperature cycles of at least 30 seconds, 60 seconds, 120 seconds, 180 seconds, 240 seconds, 360 seconds, or more with a peak temperature of at least 100° C., 200° C., 300° C., or more. Advantageously, the foregoing level of abuse test performance is expected to correspond to operation lifetimes of much greater than 2,000 hours under non-abuse conditions. For example, in some typical applications (e.g., providing hold up power for solid state drives in enterprise computing environments) the chip cap may have an operational lifetime of 5,000 hours, 7,500 hours, 10,000 hours, 12,500 hours, or more, even under conditions requiring thousands, tens of thousands, hundreds of thousands, or even millions of charge and discharge cycles.

Figure 14:
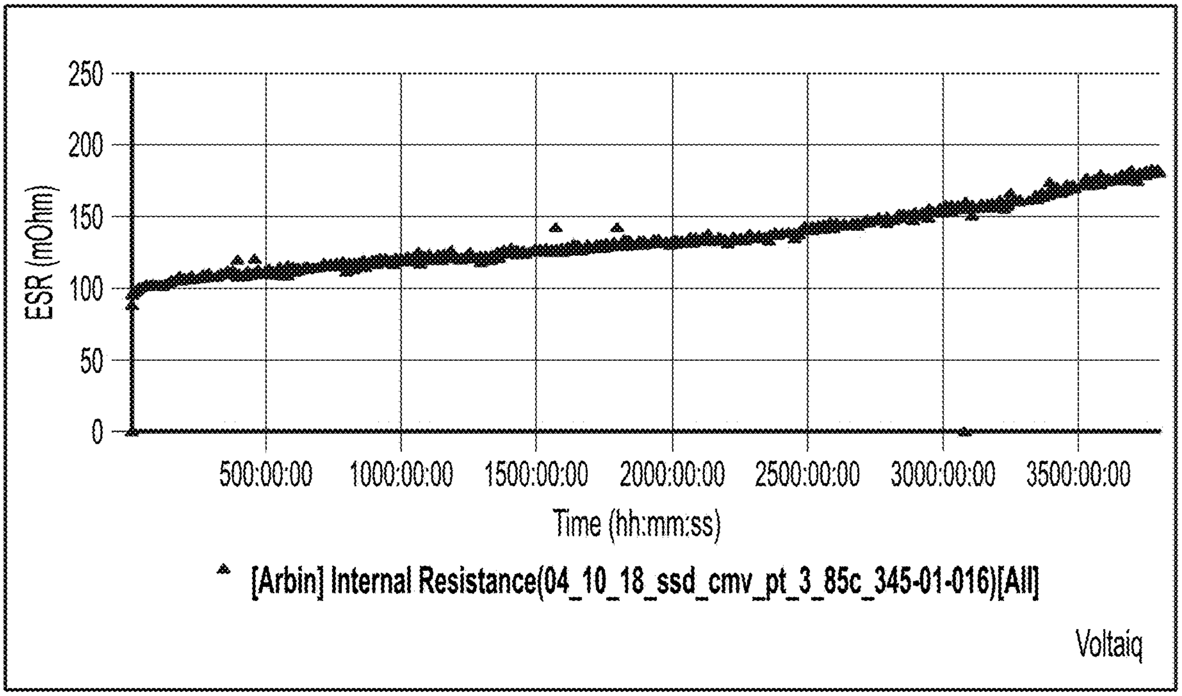
FIGS. 14 through 16 are graphs depicting aspects of performance data for an embodiment of a chip cap.
Figure 15:
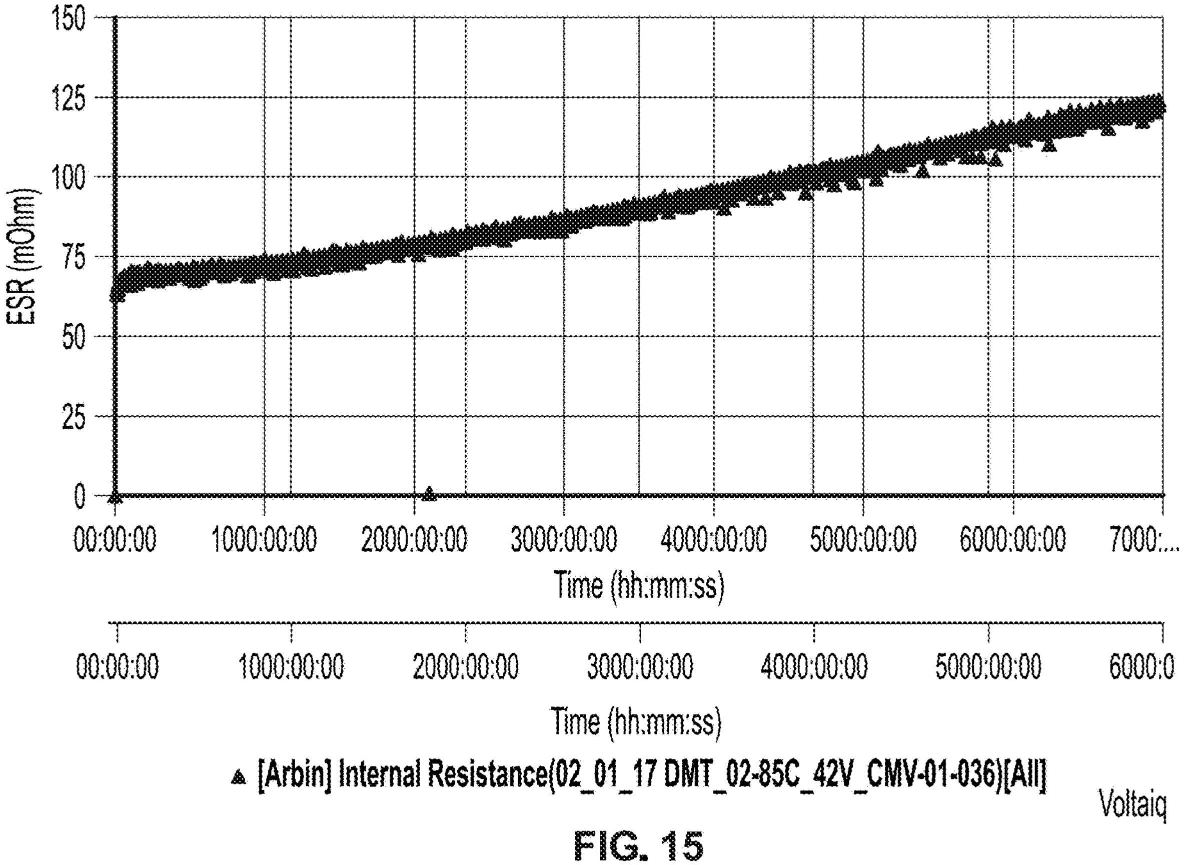
Figure 16:
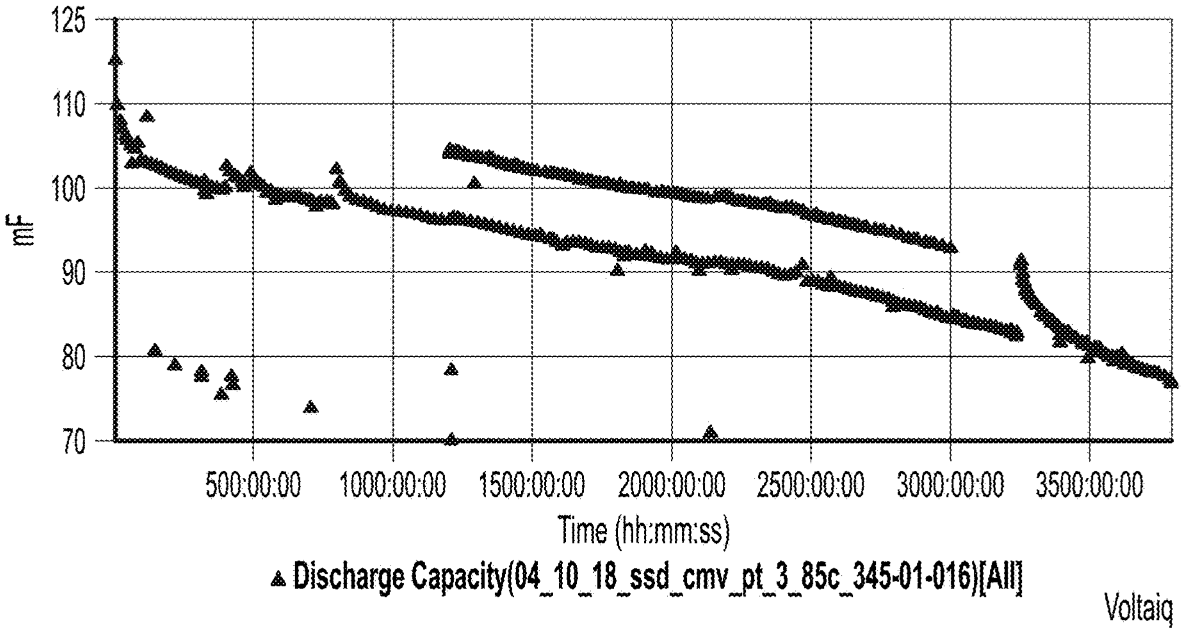

FIGS. 14 through 16 depict aspects of performance for an embodiment of the chip cap 100. FIG. 14 depicts ESR performance data for a sample chip cap running at 85° C. As shown in the graph, for 3800 hours at temperature, ESR degradation of the chip cap performance is 98 percent. Comparative data is provided in FIG. 15, which shows a substantially greater ESR degradation for a prior art device. Additional performance data for the chip cap is provided in FIG. 16. In FIG. 16, capacitance degradation data at 85° C. is only is 72% of the initial cell performance, after 3800 hours of testing.

Figure 17A:
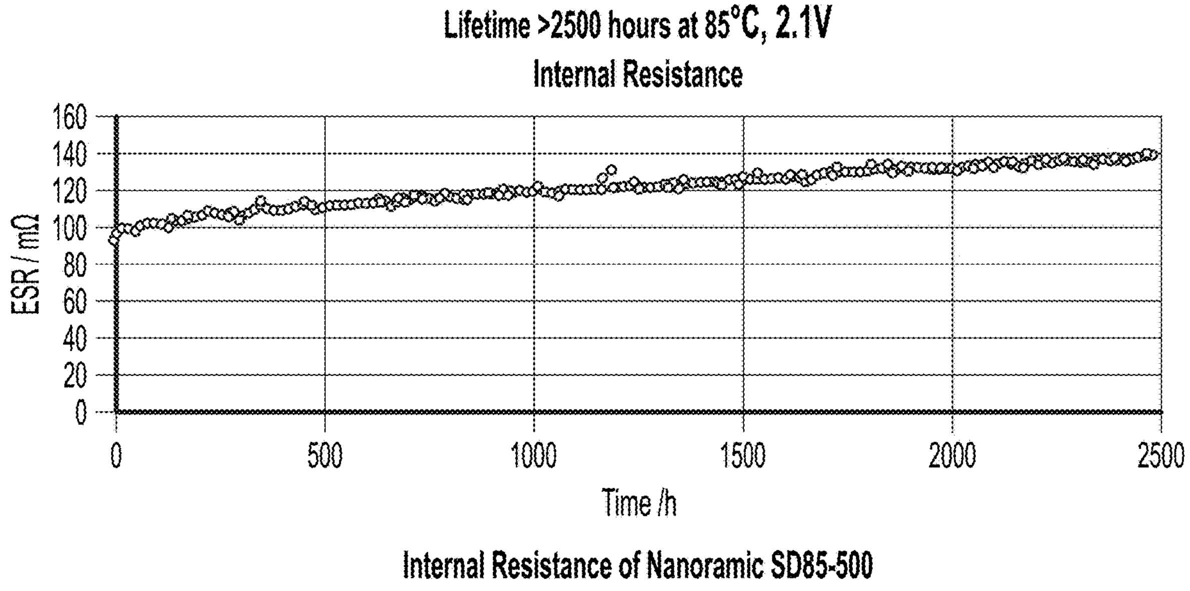
FIGS. 17A through 17B are graphs depicting aspects of performance data for an embodiment of the chip cap.
Figure 17B:
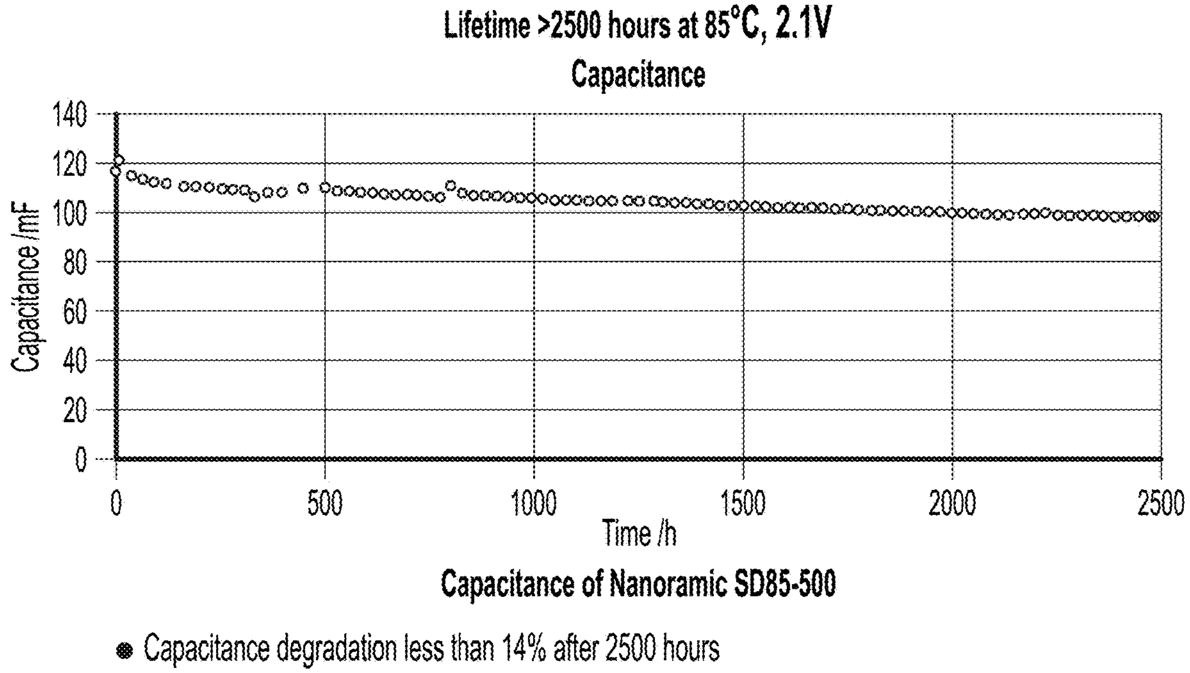

FIGS. 17A through 17B depict aspects of performance for an embodiment of the chip cap 100. FIG. 17A depicts ESR performance data for a sample chip cap running at 85° C. at a voltage of 2.1V. As shown in the graph, for 2,500 hours at temperature and voltage, ESR degradation of the chip cap performance is less than 40% percent. Additional performance data for the chip cap is provided in FIG. 17B. In FIG. 17B, capacitance degradation data at 85° C. at a voltage of 2.1V is less than 14% of the initial cell performance, after 2,500 hours of testing. Note that testing was preformed after successfully subjecting the chip cap to a solder reflow process.

Figure 18A:
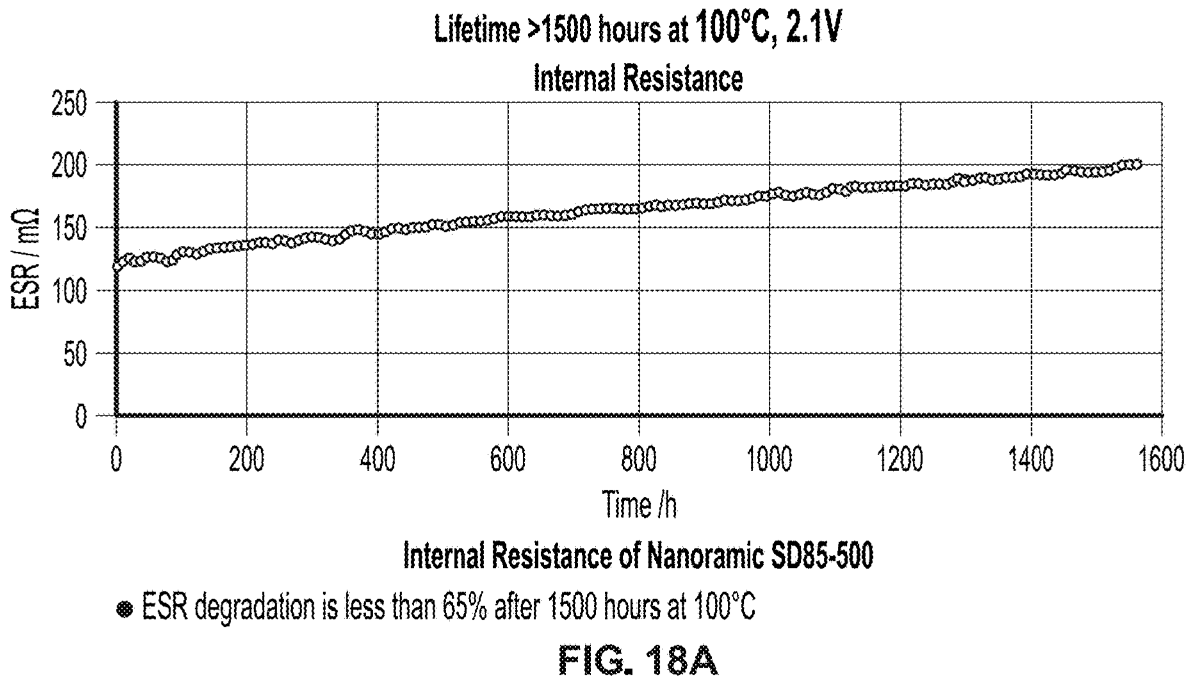
FIGS. 18A through 18B are graphs depicting aspects of performance data for an embodiment of the chip cap.
Figure 18B:
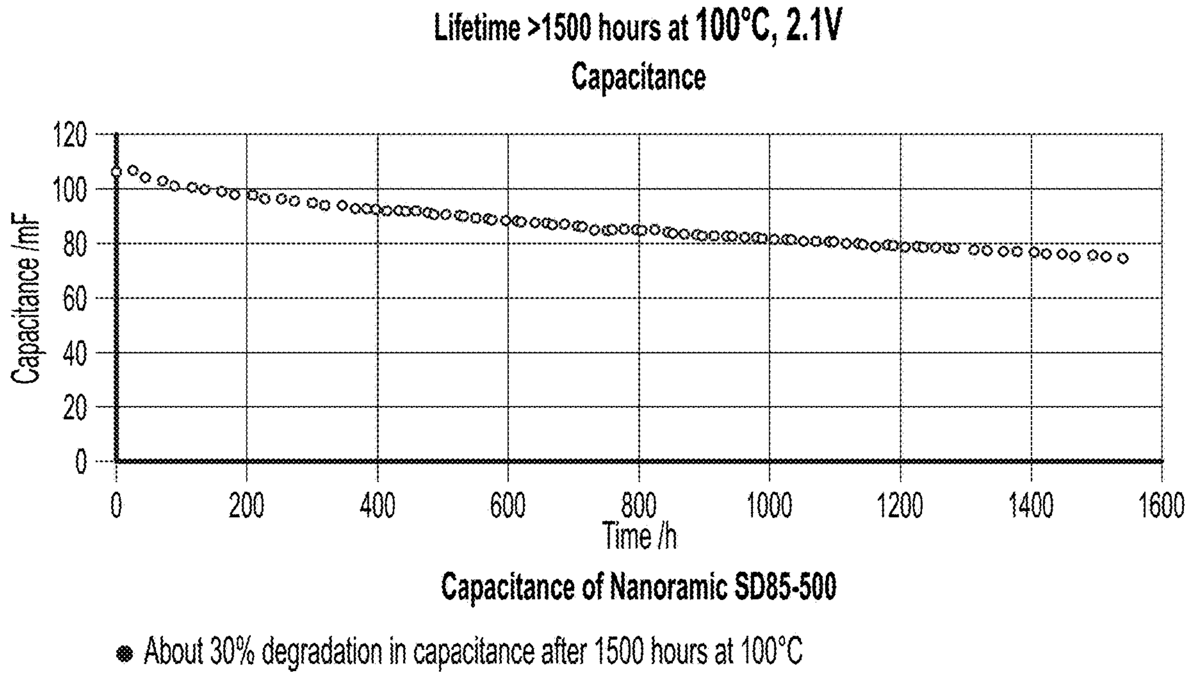

FIGS. 18A through 18B depict aspects of performance for an embodiment of the chip cap 100. FIG. 18A depicts ESR performance data for a sample chip cap running at 100° C. at a voltage of 2.1V. As shown in the graph, for 1,500 hours at temperature and voltage, ESR degradation of the chip cap performance is less than 65% percent. Additional performance data for the chip cap is provided in FIG. 18B. In FIG. 18B, capacitance degradation data at 100° C. at a voltage of 2.1V is less than 14% of the initial cell performance, after 1,500 hours of testing. Note that testing was preformed after successfully subjecting the chip cap to a solder reflow process.

Figure 19:
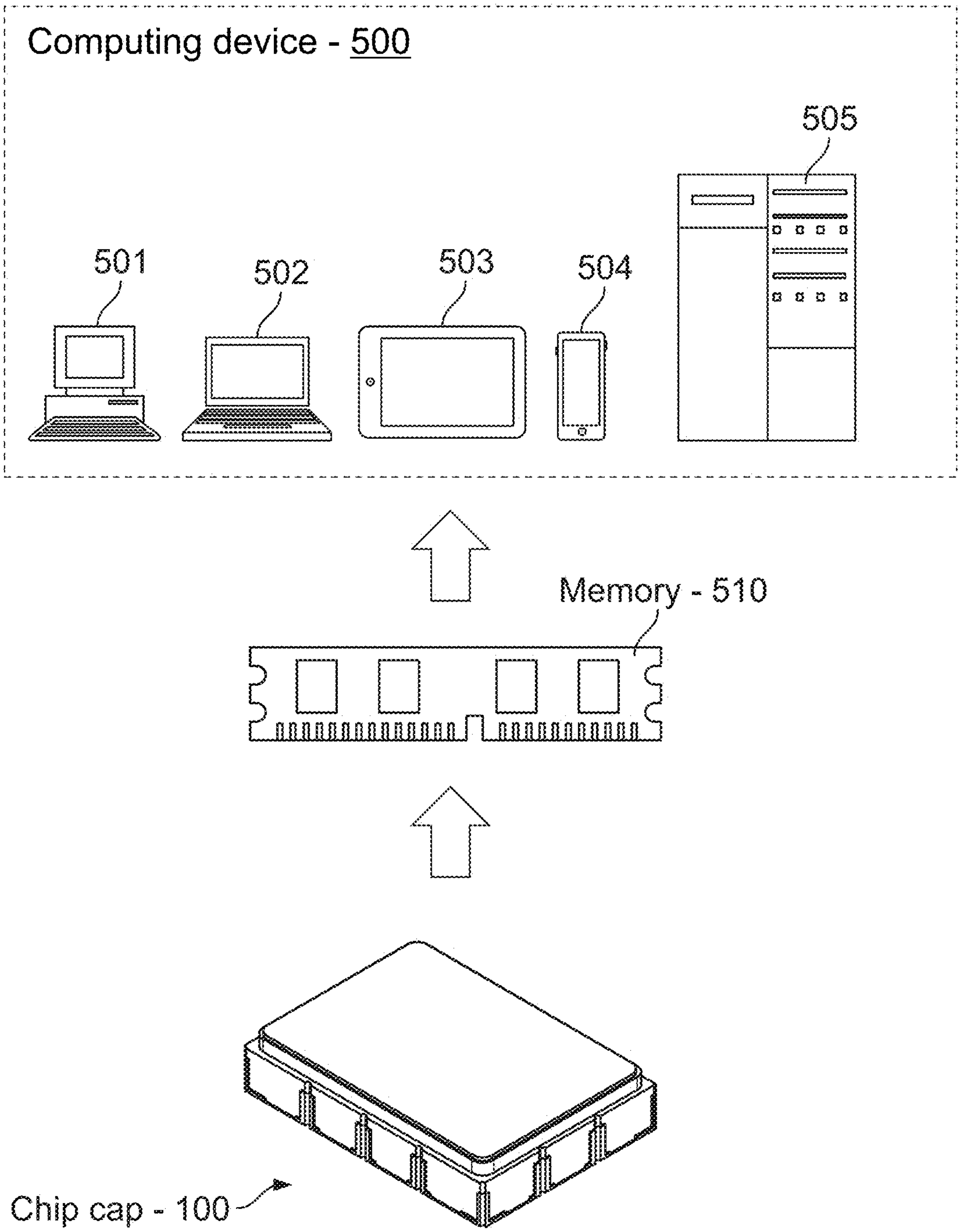
FIG. 19 is a schematic diagram depicting systems for making use of the chip cap of FIG. 2.

Referring to FIG. 19, there are shown examples of computing devices 500 that may make use of the chip cap 100. The computing devices 500 may be any one of a personal computer (PC) 501, a laptop 502, a tablet 503, a mobile device (such as a smartphone), and a server 505. Other types of computing devices may be included. Examples include controllers for automotive systems as well as industrial systems, residential systems (such as appliances, home electronics and others). In short, the computing devices making use of the chip cap 100 may include just about any electronic device where board level power is desired (e.g., solid state drives used in enterprise computing). In some embodiments, e.g., where the chip has an operating temperature rating of 100° C., 125° C., 150° C., or more, the chip cap may be used in extreme down hole conditions know in field of oil and gas exploration and production.

In the illustration shown, the chip cap 100 is used to supply power to computer memory 501. The memory 510 may be any type of memory. Not shown are power converters and controllers appropriate for converting power from the chip cap 100, as such devices are known in the art.

Figure 20:
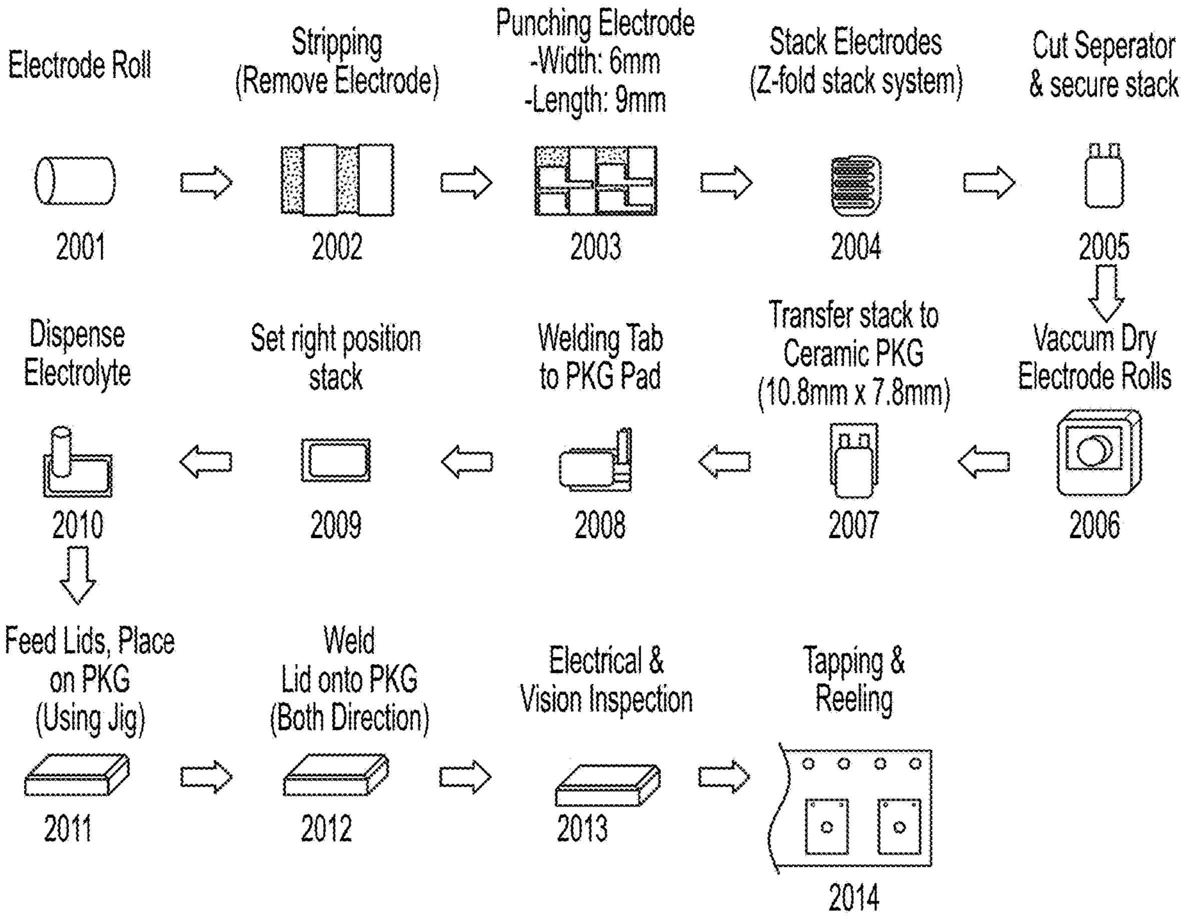
FIG. 20 is a schematic diagram depicting a process flow for making the chip cap of FIG. 2.
Figure 21:
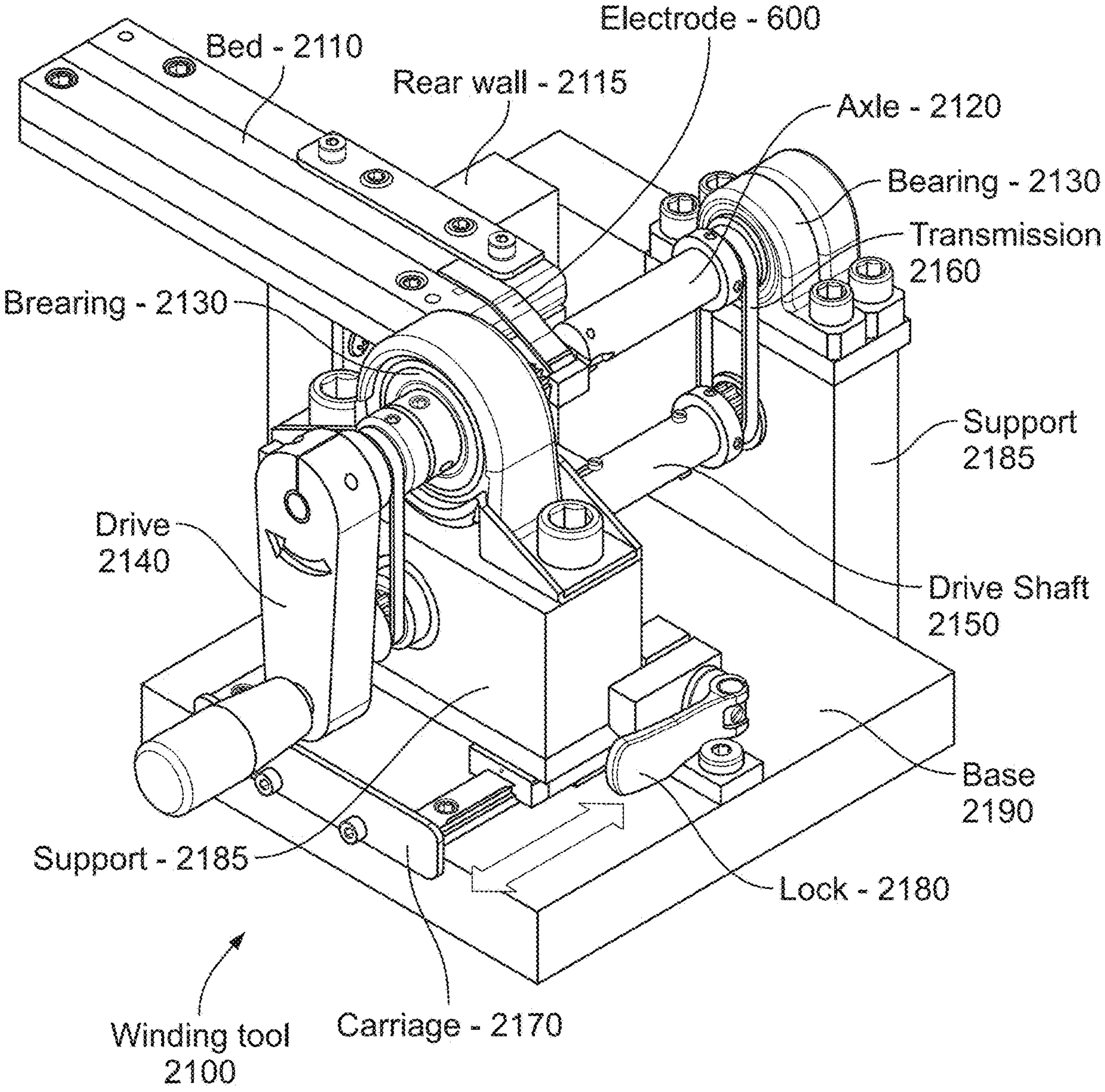
FIGS. 21 through 25 depict aspects of a wound storage cell and a winding tool for fabricating the wound storage cell.
Figure 22:
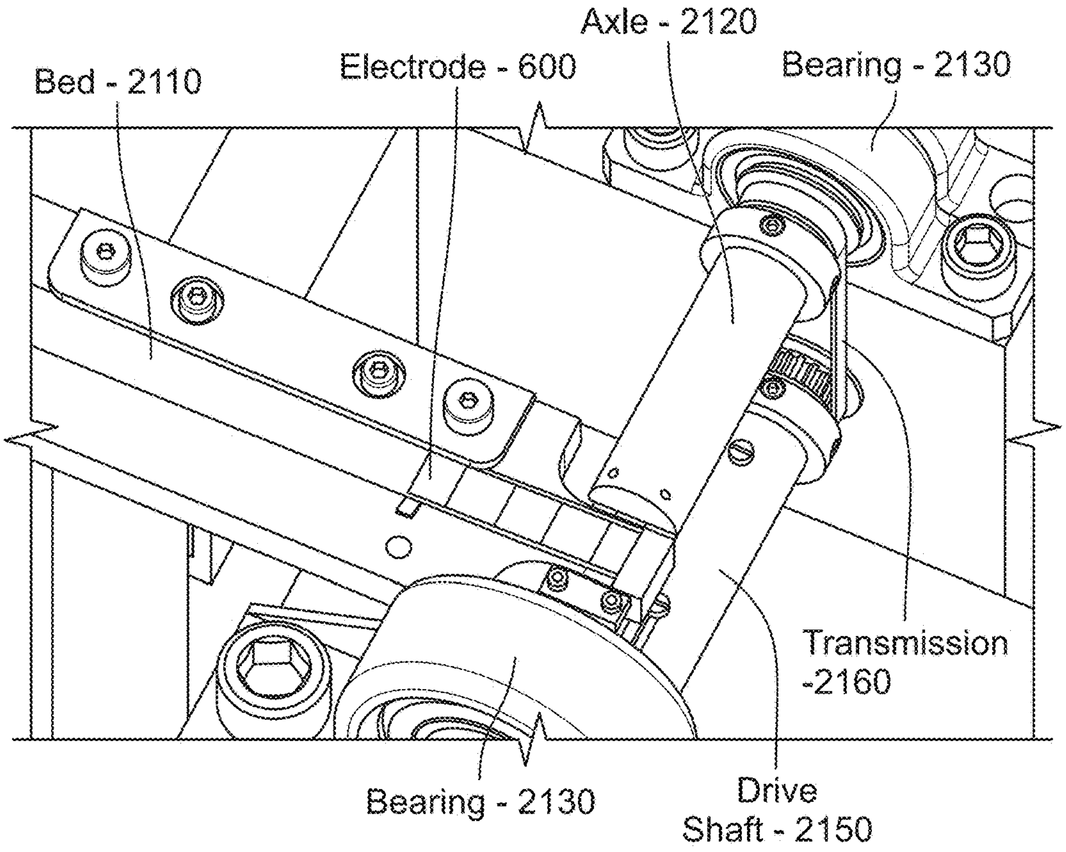

Referring to FIG. 20, a process flow is shown for assembling a chip cap of the type disclosed herein. In step 2001 an electrode roll is provided. The electrode roll may be a double-sided electrode roll having carbonaceous energy storage media on opposite faces of a metallic foil current collector. In step 2002 a portion of the carbonaceous energy storage media is removed (e.g., via scraping) to expose strips of the current collector. In step 2003, right and left handed electrode layers are punched or cut from the roll, with conductive tabs formed from the exposed portions of the roll. In step 2004 the punched electrode layers are assembled with a separator to form a stack of the type described in detail herein. In step 2005, any excess separator is cut and the stack is secured, such that conductive tabs extend from the stack. In step 2006 the electrode stacks are vacuum dried to remove moisture. In step 2007 the stacks are transferred into the open body of a respective package. In step 2008, electrical connections are made from the stack to contact pads in the package, as detailed herein. In step 2009, the stack is positioned in the package. In step 2010 electrolyte is dispensed to wet the electrode layers of the stack. In step 2011 a lid is placed on the package. In step 2012 the lid is welded to the package to form a hermetic seal. In step 2013 the finished chip cap undergoes visual inspection and electrical testing. In step 2014 the chip caps are packaged, e.g., by taping and reeling the packages in a format suitable for pick and place installation techniques familiar in the art.

Aspects of tooling and equipment for winding the jellyroll are presented with regards to FIG. 21 through FIG. 25.

Referring to FIGS. 21 through 24, aspects an exemplary winding tool 2100 are shown. In this example, the winding tool 2100 includes a bed 2110. Generally, the bed 2110 provides a resting place for the two-sided electrode 600 in preparation for assembly. The bed 2110 may be mounted onto a rear wall 2115 that is mounted to a base 2190. The bed may be mounted upon a hinge on the rear wall 2115. Opposing supports 2185, orthogonally oriented to the rear wall 2115, provide support for bearing assemblies 2130 (or "bearings") mounted thereto. Each of the bearings 2130 is host to a portion of a split axle 2120. As a matter of convention, the support 2185 of a "proximal side" of the winding tool 2100 includes a drive 2140. Driving the drive 2140 causes driveshaft 2150 to drive transmission 2160 in turn rotating axle 2120.

The support 2185 of either or both sides (in this case, shown as the proximal side) may be mounted upon a carriage 2170. Generally, the carriage 2170 provides for articulation of the proximal side of the axle 2120 toward and away from the opposing portion (or "distal side") of the axle 2120 as shown by the directional arrow of FIG. 21. A lock 2180 may be included to limit the lateral articulation as appropriate.

Figure 24:
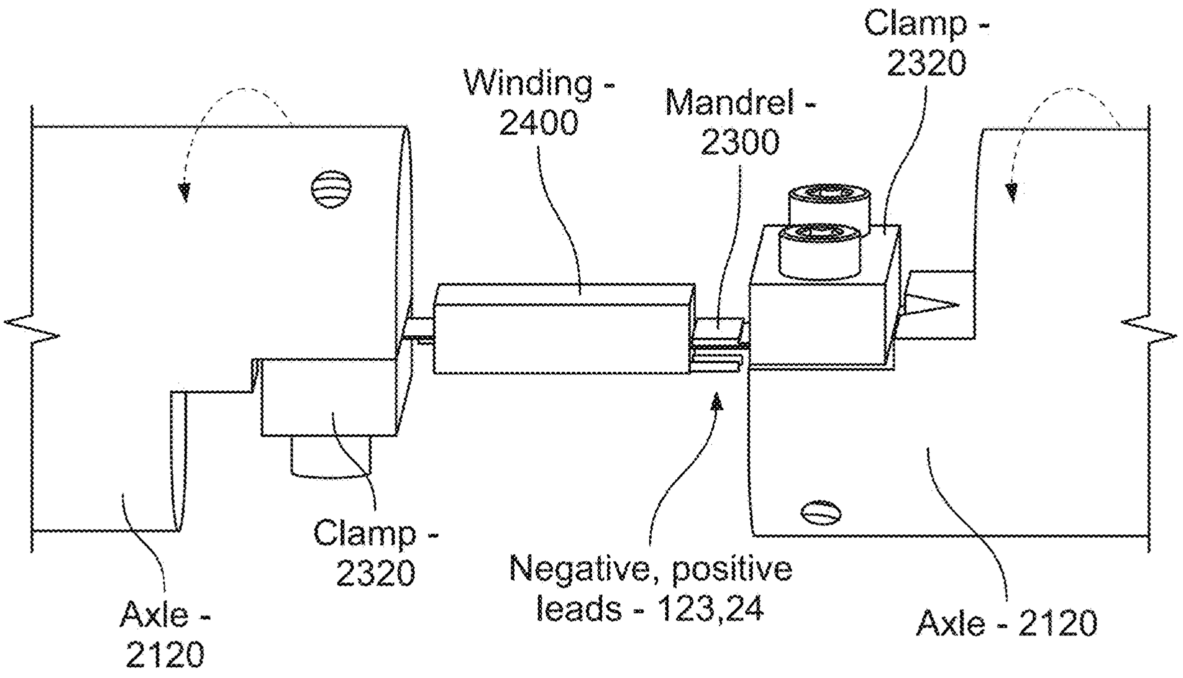
Figure 25:
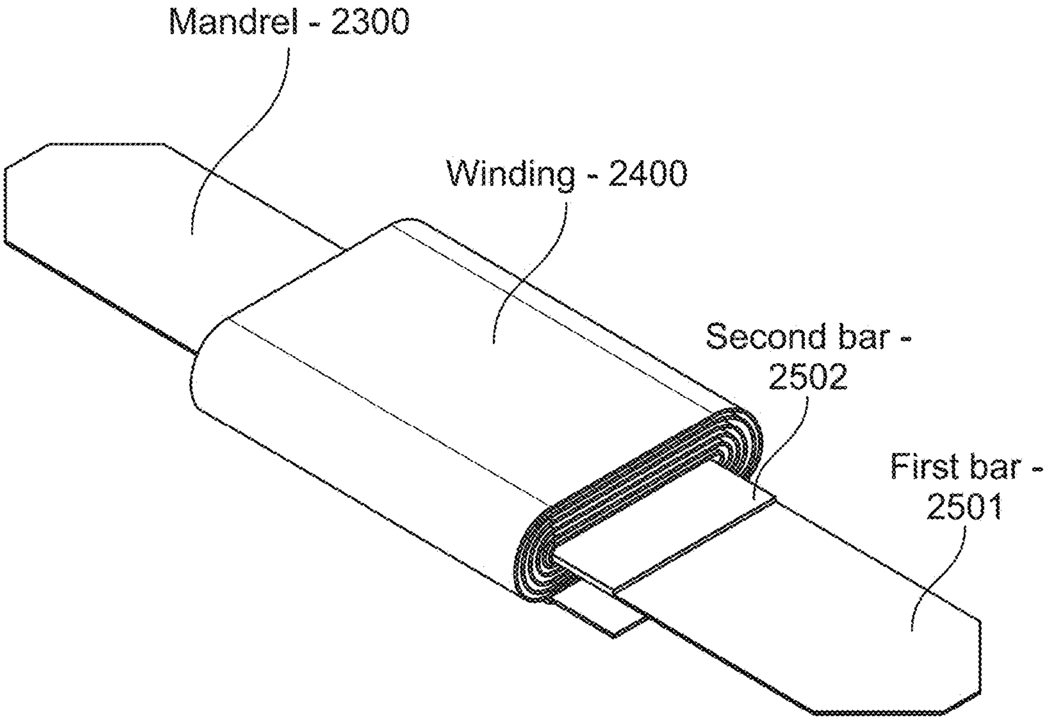
Figure 26:
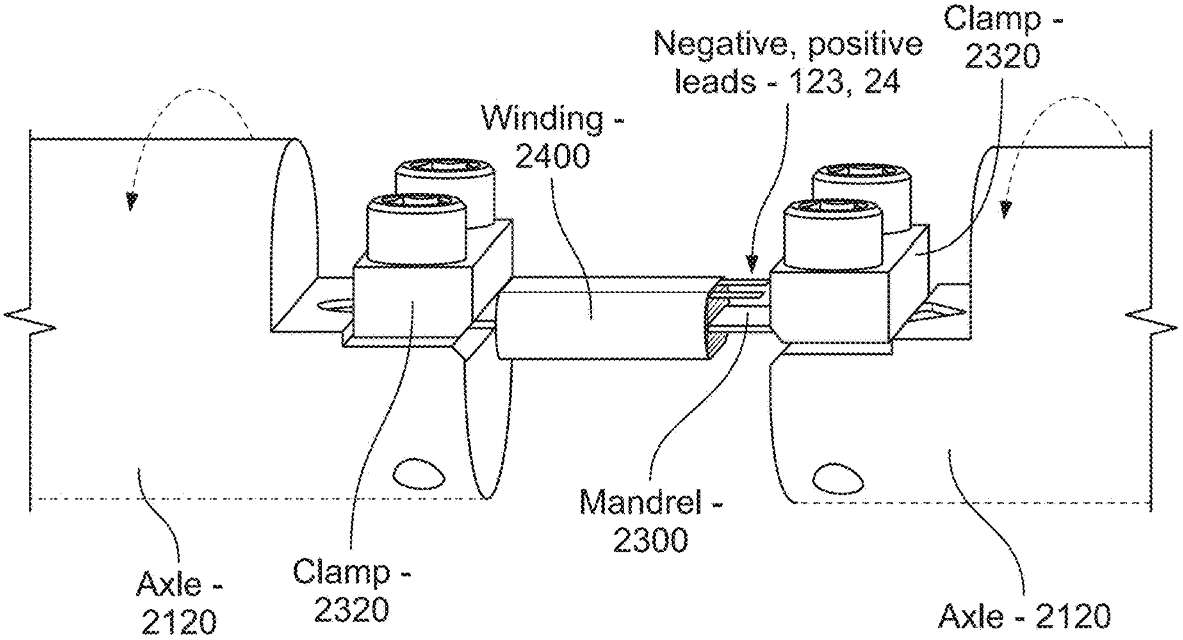
FIG. 26 depicts aspects of another configuration of a mandrel retention system with the wound storage cell.
Figure 27:
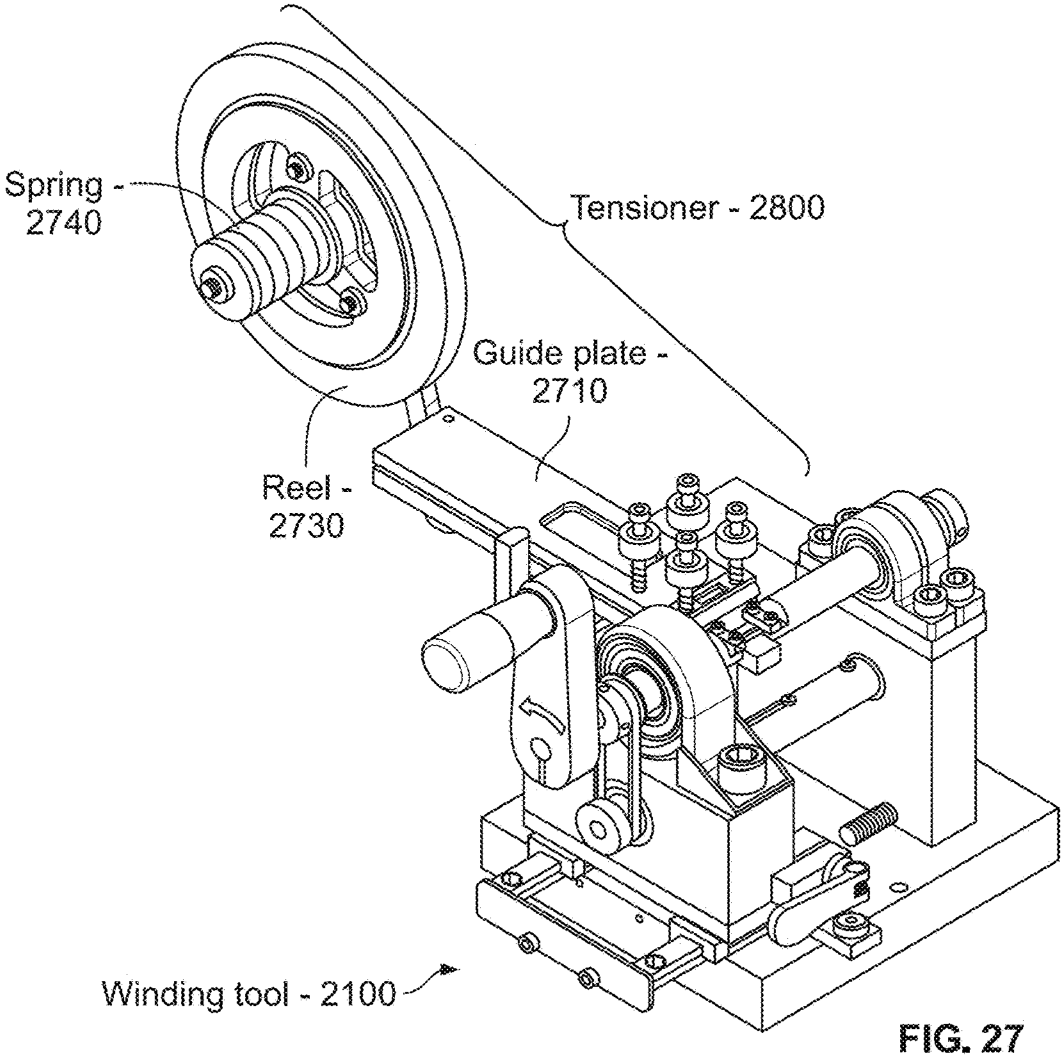
FIG. 27 is a schematic illustration of an embodiment of the winding tool that includes a tensioning system (i.e., tensioner)

Each portion of the axle 2120 terminates with a configuration for receiving a mandrel 2300. In this example, the termination includes a clamp 2320, as best shown in FIG. 24. Opposing clamps 2320 may be offset from each other in order to minimize mechanical stress or bias. In FIG. 24, the offset is by 180 degrees. Another arrangement for the clamps 2320 is depicted in FIG. 26.

When fabricating a wound storage cell, in one embodiment, the proximal side of the split axle 2120 is moved away from the distal side of the axle 2120. A length of the separator 5 is then disposed onto the bed 2110. About half of the length is disposed onto the bed 2110, while the remaining half of the length extends beyond the mandrel 2300. The mandrel 2300 may then be inserted into a loosely set clamp 2320 of the distal side and disposed over the separator 5. A first one of the two-sided electrodes 600 is then disposed over the separator 5 and under the mandrel 2300. The portion of the bed 2110 in contact with the mandrel 2300 may be articulated downward by action of the hinge on the rear wall 2115. Once the first one of the two-sided electrodes 600 and the separator 5 are aligned on the bed and under the mandrel 2300, the second bar 2502 is lifted and the remaining length of separator 5 is run between the first bar 2501 and the second bar 2502 and back over the first one of the two-sided electrodes 600 laying on the bed 2110. Thus, the first one of the two-sided electrodes 600 is disposed between layers of a the single separator 5.

The proximal side of the axle 2120 is then articulated toward the distal side by use of the carriage 2170 such that clamps 2320 receive opposing ends of the mandrel 2300. Once the clamps 2320 have received the mandrel 2300, the clamps 2320 are clamped and the mandrel 2300 is secured. The optional lock 2180 may also be locked to limit lateral forces.

The axle 2120 is then rotated between about 130° and 170° (or so) and the second two-sided electrode 600 is disposed on top of the separator 5 and pushed forward to a point where it is pinched between separator material. Thus, the second two-sided electrode 600 lays over the separator 5 and, in turn, the first two-sided electrode 600. The axle 2120 is then rotated which results in winding of the combination of the first two-sided electrode 600 and the second two-sided electrode 600 which are separated by the separator 5.

Once winding has been completed the clamps 2320 are released and the combination of mandrel 2300 and storage cell 105 wound thereon are removed from the winding tool 2100. The two bars of the mandrel 2300 are then withdrawn from the winding used to form the storage cell 105. The winding may then be finished with trimming of separator material and any further steps as deemed appropriate (such as flattening of the winding).

As shown in FIG. 26, the clamps 2320 may be secured from the same rotational position (i.e., side) of the axle 2120. In this configuration, the opposing clamps 2320 (i.e., the left clamp 2320 and the right clamp 2320) may be accessed in a single stop (i.e., without a requirement for additional rotation of the axle 2120).

Figure 6B:
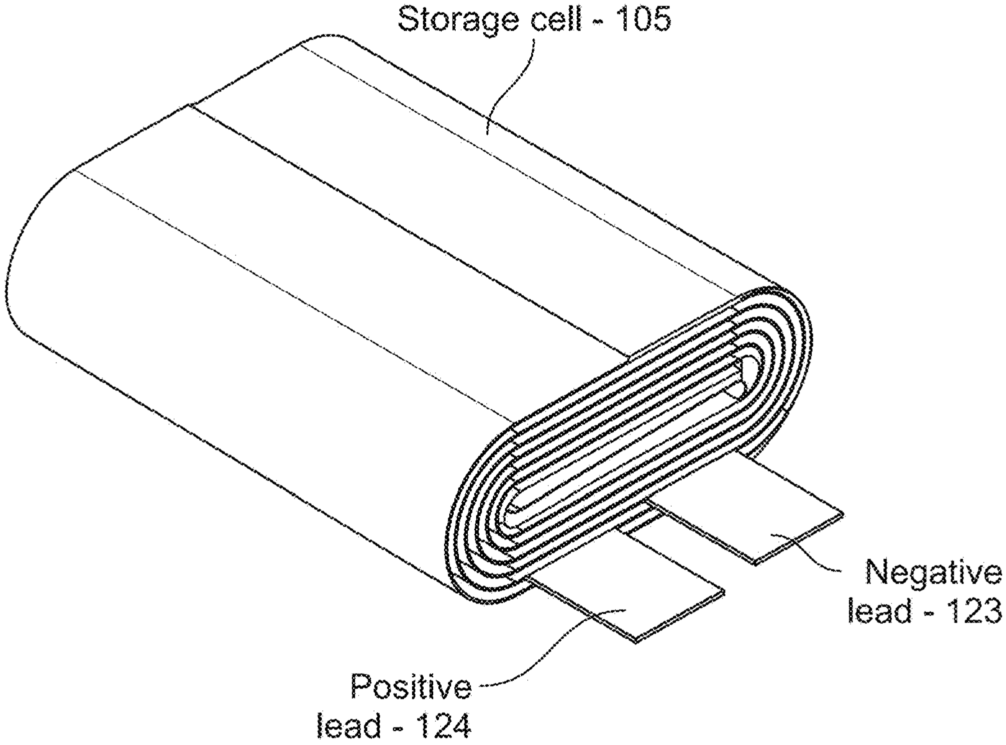
FIG. 6B is an isomeric view depicting the storage cell resulting from the embodiment of FIG. 5B.
Figure 23:
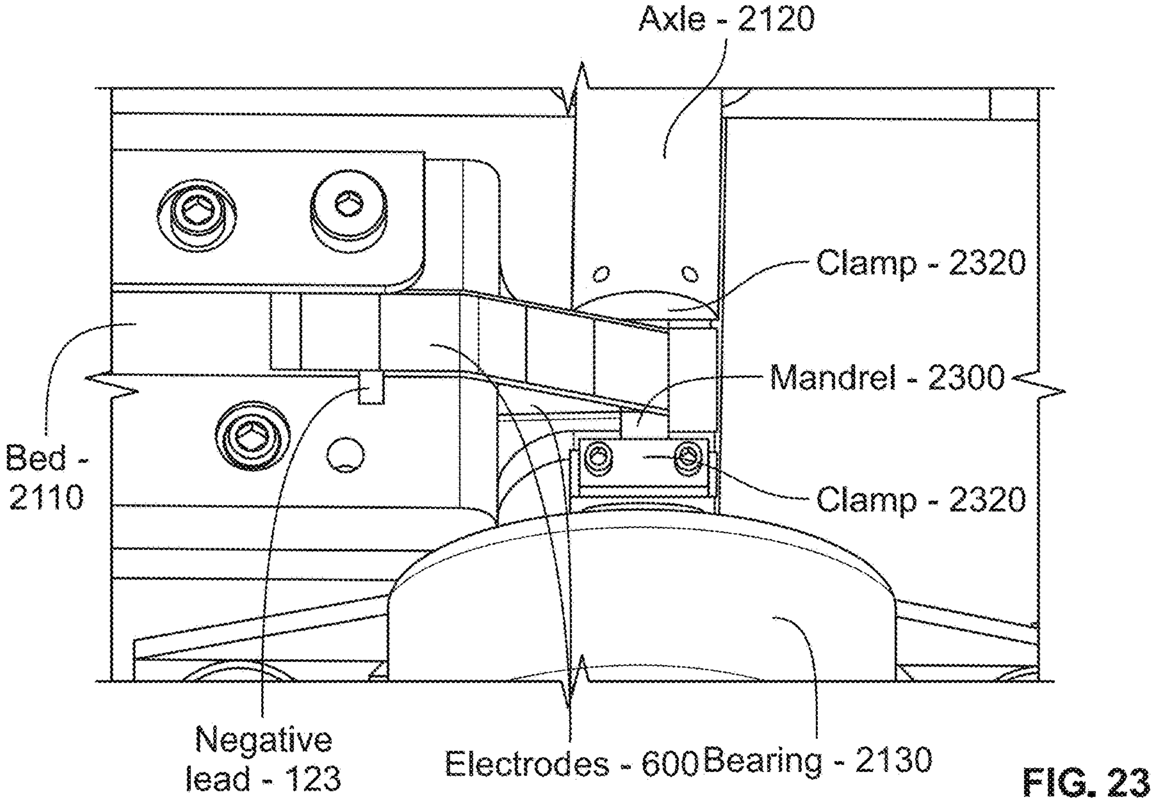

As shown in FIG. 23, the electrode 600 may include a single negative lead 123. Similarly, the second electrode may contain a single positive lead 124. In some embodiments, multiple leads are included for each polarity (123, 124). One example of the resulting storage cell 105 is depicted in FIG. 6B.

FIG. 27 through FIG. 31 depict aspects of a tensioning system, also referred to herein as a "tensioner" 2800. Generally, the tensioner 2800 ensures a uniform feed of electrode material into the winding 2400 as the winding is wound into the energy storage cell 105.

In this example, the tensioner 2800 includes a reel 2730. The reel 2730 is situated so as to provide a consistent feed of electrode material to an intake between the bed 2110 and a covering guide plate 2710. The guide plate 2710 ensures the electrode material feeds smoothly by remaining flat as the electrode material is fed into the winding 2400. The uniform feed is further aided by application of tension caused by spring 2740. The tension affirmatively resolves any wrinkles as may occur in the electrode material as it leaves the bed 2110 and enters the winding 2400.

Figure 28:
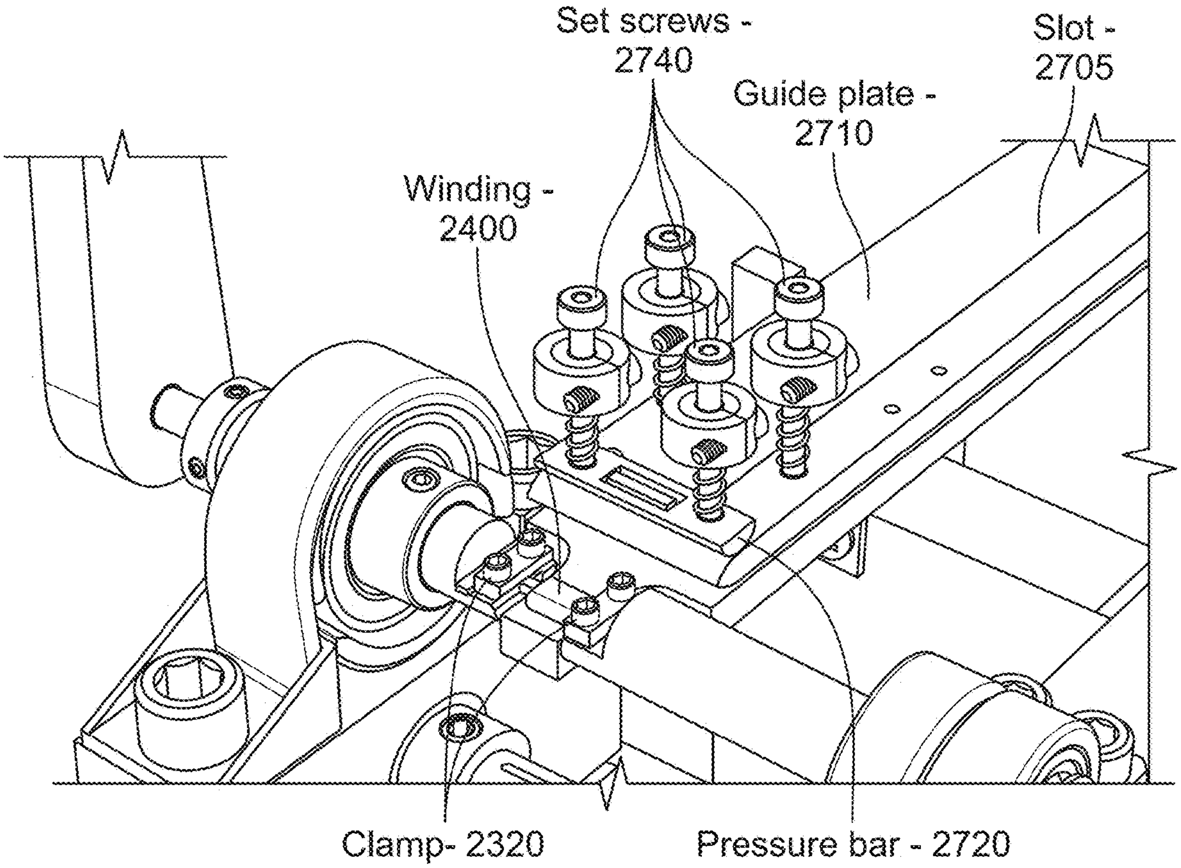
FIG. 28 is a perspective view graphic diagram depicting a portion of the winding tool that includes a guide plate from the tensioning system of FIG. 27.
Figure 29:
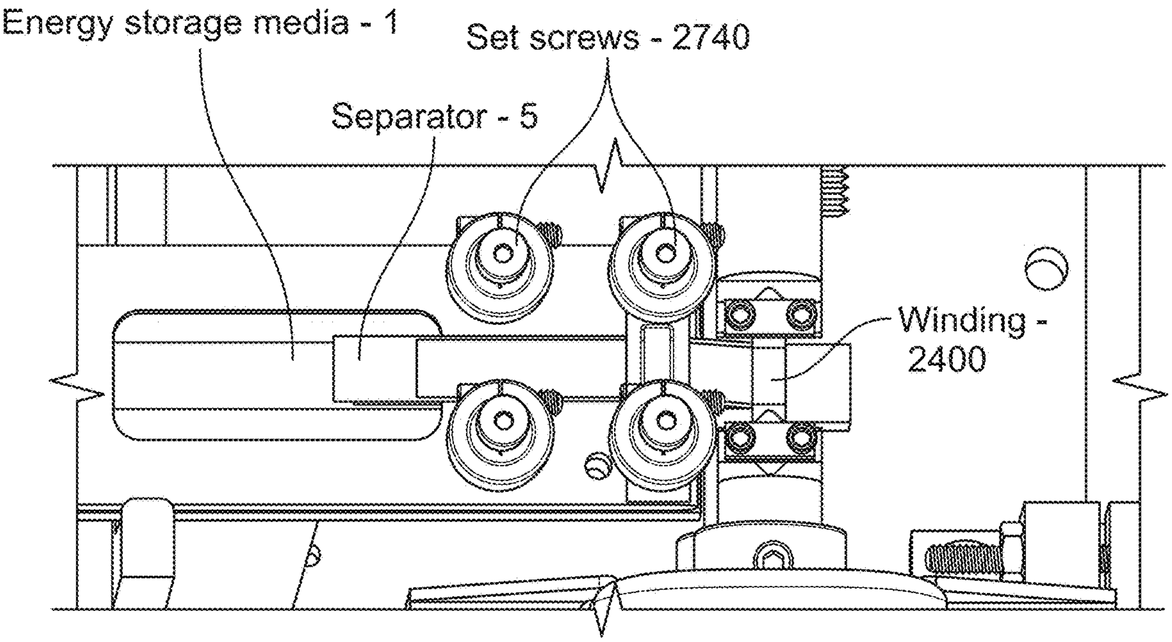
FIG. 29 is a top-down perspective view of the arrangement depicted in FIG. 28 with energy storage media loaded therein.
Figure 30:
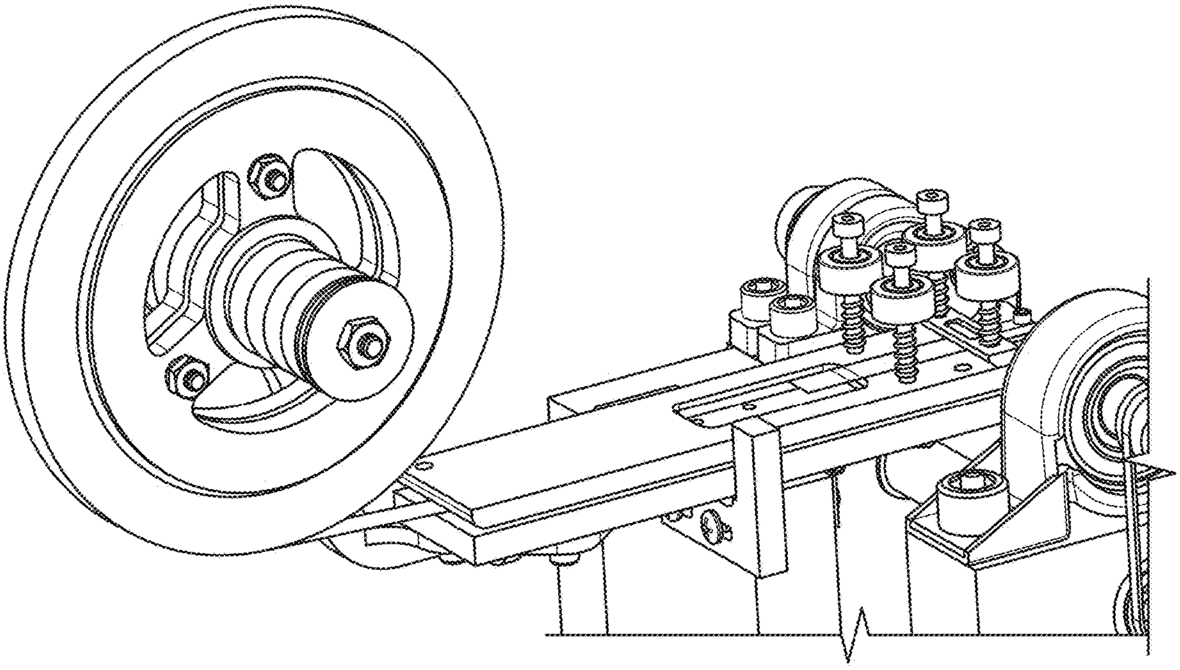
FIG. 30 depicts aspects of the tensioning system from a perspective side-view.

As shown in FIG. 28, the guide plate 2710 may be attached with fasteners such as a plurality of set screws 2740. Other fasteners, such as those adapted for quick connection and release, may be used. The guide plate 2710 and the bed 2110 may include respective grooves or at least one slot 2705 to guide passage of the energy storage media 1. Incorporation of the at least one slot 2705 In some embodiments, the tensioner system may further include a pressure bar 2720. The pressure bar 2720 may be useful for refining pressure on the guide plate 2710 and thereby adjustment of performance of the guide plate 2710. In this illustration, the guide plate 2710 is fabricated from substantially transparent material, such as acrylic or polycarbonate. FIG. 29 is a top-down view of a portion of the tensioner 2800. In this illustration, the tensioner 2800 includes a window 2708. Both of these embodiments permit visual inspection and lets an operator ensure the smooth flow of energy storage media 1. FIG. 30 depicts the tensioner 2800 shown in FIG. 29 in a perspective view.

Figure 31:
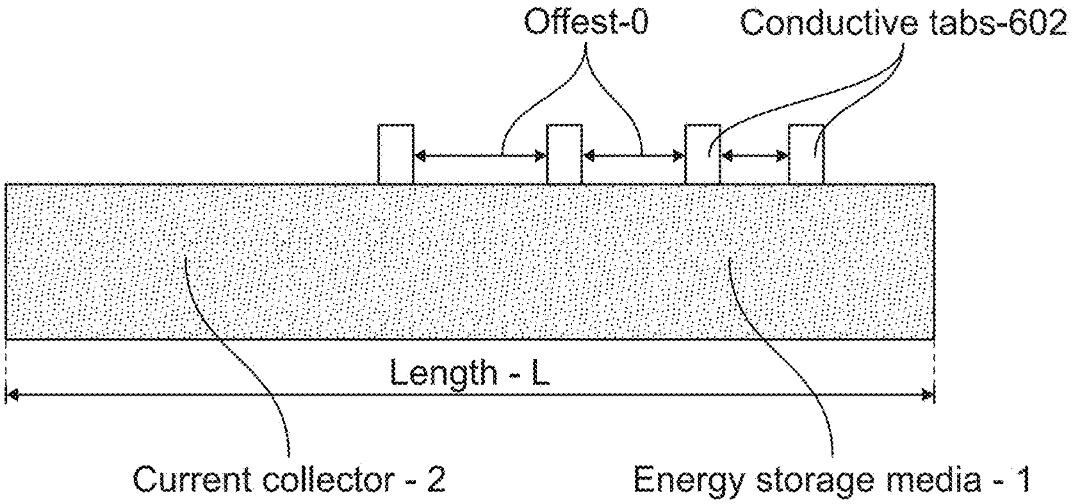
FIG. 31 depicts aspects of an electrode suited for use in the winding tool to provide for the wound storage cell of FIG. 5B and FIG. 6B.

As shown in FIG. 31, the current collector 2 (with the energy storage media 1 disposed thereon) may include a plurality of conductive tabs 602. The conductive tabs 602 are set apart laterally by offset (O). The offset (O) increases incrementally to account for increasing radius in the winding process. This results in alignment of the conductive tabs 602, such that in the wound storage cell 105 (see FIG. 12) the conductive tabs 602 collectively result in leaders that align with the respective pads 110.

Other embodiments of a wound storage cell may be had. For example, the wound storage cell may include two separators instead of a single, continuous separator. The wound storage cell may be fabricated using continuous lengths of electrode and separator materials with periodic segmentation of elements as each wind is completed. Accordingly, the techniques disclosed herein are merely illustrative of ways to provide a wound storage cell.

Generally, the term "memory" as used herein refers to the computer hardware integrated circuits that store information for immediate use in a computer and is synonymous with the term "primary storage." Computer memory operates at a high speed, for example random-access memory (RAM), as a distinction from storage that provides slow-to-access information but offers higher capacities.

The terms "memory," "primary storage," "main memory," "system memory" and other similar terms are often associated with addressable semiconductor memory, i.e. integrated circuits that include silicon-based transistors, used for example as primary storage but also other purposes in computers and other digital electronic devices. There are two main kinds of semiconductor memory, volatile and non-volatile. Examples of non-volatile memory are flash memory (used as secondary memory) and ROM, PROM, EPROM and EEPROM memory (used for storing firmware such as BIOS). Examples of volatile memory are primary storage, which is typically dynamic random-access memory (DRAM), and fast CPU cache memory, which is typically static random-access memory (SRAM) that is fast but energy-consuming, offering lower memory areal density than DRAM.

Volatile memory is computer memory that requires power to maintain the stored information. Most modern semiconductor volatile memory is either static RAM (SRAM) or dynamic RAM (DRAM). SRAM retains its contents as long as the power is connected. Dynamic RAM is more complicated for interfacing and control, needing regular refresh cycles to prevent losing its contents.

Non-volatile memory is computer memory that can retain the stored information even when not powered. Examples of non-volatile memory include read-only memory (see ROM), flash memory, most types of magnetic computer storage devices (e.g. hard disk drives, floppy disks and magnetic tape), optical discs, and early computer storage methods such as paper tape and punched cards. Forthcoming non-volatile memory technologies include FeRAM, CBRAM, PRAM, STT-RAM, SONOS, RRAM, racetrack memory, NRAM, 3D)(Point, and millipede memory.

A third category of memory is "semi-volatile." The term "semi-volatile" generally describes a memory which has some limited non-volatile duration after power is removed, but then data is ultimately lost. A typical goal when using a semi-volatile memory is to provide high performance/durability/etc. associated with volatile memories, while providing some benefits of a true non-volatile memory.

A solid-state drive (SSD) is a solid-state storage device that uses integrated circuit assemblies as memory to store data persistently. SSDs have no moving mechanical components. This distinguishes them from conventional electromechanical drives such as hard disk drives (HDDs) or floppy disks, which contain spinning disks and movable read/write heads. Compared with electromechanical drives, SSDs are typically more resistant to physical shock, run silently, have quicker access time and lower latency.

As of 2017, most SSDs use NAND-based flash memory, which is a type of non-volatile memory that retains data when power is lost. For applications requiring fast access but not necessarily data persistence after power loss, SSDs may be constructed from random-access memory (RAM). Such devices may employ batteries as integrated power sources to retain data for a certain amount of time after external power is lost.

However, all SSDs still store data in electrical charges, which slowly leak over time if left without power. This causes worn out drives (that have exceeded their endurance rating) to start losing data typically after some time in storage. Therefore, present SSDs are not suited for archival purposes.

Accordingly, performance of SSDs can be substantially improved with the addition of improved power supplies. Many SSDs use capacitors to provide backup power to the DRAM modules to write the volatile memory to non-volatile memory. Unfortunately, the available capacitors are large and exhibit low performance.

In short, the SSD environment presents unique challenges for all capacitive energy storage, not only ultracapacitor technology. Capacitive storage is used as on-board electrical energy backup to transfer data stored in volatile memory (SRAM/DRAM) into non-volatile memory (NAND, FLASH). The operation is critical to ensuring that no data is lost in the event of a power failure. As computing storage grows ever more important to nearly all business sectors, the need for an ultra-reliable memory backup solution is a priority.

Having thus introduced embodiments of an energy storage device for powering electrical circuits, some additional aspects are now presented.

Various other components may be included and called upon for providing for aspects of the teachings herein. For example, additional materials, combinations of materials and/or omission of materials may be used to provide for added embodiments that are within the scope of the teachings herein.

A variety of modifications of the teachings herein may be realized. Generally, modifications may be designed according to the needs of a user, designer, manufacturer or other similarly interested party. The modifications may be intended to meet a particular standard of performance considered important by that party.

The appended claims or claim elements should not be construed to invoke 35 U.S.C. § 112(f) unless the words "means for" or "step for" are explicitly used in the particular claim.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements. As used herein, the term "exemplary" is not intended to imply a superlative example. Rather, "exemplary" refers to an example of an embodiment that is one of many possible embodiments.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An energy storage device comprising:

an energy storage cell comprising:

an electrolyte;

a plurality of two-sided electrodes; and a single separator; wherein the plurality of two-sided electrodes and the single separator are immersed in the electrolyte; wherein a first electrode of the plurality of electrodes is disposed onto one end of the single separator and wherein a second electrode of the plurality of electrodes is disposed onto an opposing end of the same single separator; and continuous strips of the two-sided electrodes are wound into a roll form and separated by the single separator forming a stack comprising a two-sided negative electrode and a two-sided positive electrode;

wherein the energy storage cell is wound into a roll, and each of the first electrodes and each of the second electrodes contact multiple electrically conductive tabs that extend beyond the energy storage cell and each of the conductive tabs are offset laterally sideways from each other to accommodate for an increasing radius of the energy storage cell in the roll;

wherein the multiple electrically conductive tabs collectively result in leaders aligned with electrical pads of a housing body; and wherein the energy storage cell is an ultracapacitor capable of surviving reflow processing.

2. The energy storage device of claim 1, wherein the energy storage cell is disposed in a body that is fitted with a lid; wherein the body and the lid is configured for surface mounting on a printed circuit board with a solder reflow process.

3. The energy storage device of claim 1, wherein an interior of the lid and an interior of the body are protected with a protective layer.

4. The energy storage device of claim 3, wherein the protective layer comprises polytetrafluoroethylene or polyimide.

5. The energy storage device of claim 1, wherein a two-sided electrode of the plurality of two-sided electrodes comprises a current collector with energy storage media disposed on either side of the current collector.

6. The energy storage device of claim 5, wherein the current collector comprises aluminum and wherein the energy storage media comprises an active material.

7. The energy storage device of claim 6, wherein the active material is disposed on the current collector without the aid of binder.

8. The energy storage device of claim 6, wherein active material comprises activated carbon bound together by a matrix of carbon nanotubes.

9. The energy storage device of claim 6, wherein the active material comprises vertically aligned carbon nanotubes.

10. The energy storage device of claim 1, where the plurality of two-sided electrodes comprise a plurality of left-handed two-sided electrodes and a plurality of right handed two-sided electrodes.

11. The energy storage device of claim 1, wherein the single separator comprises polytetrafluoroethylene.

12. The energy storage device of claim 1, wherein the second electrode is oppositely disposed to the first electrode.

13. A method comprising:

disposing in a body cavity of a body:

an energy storage cell comprising:

an electrolyte;

a plurality of two-sided electrodes; and a single separator; wherein the plurality of two-sided electrodes and the single separator are immersed in the electrolyte; wherein a first electrode of the plurality of electrodes is disposed onto one end of the single separator and wherein a second electrode of the plurality of electrodes is disposed onto an opposing end of the same single separator; and continuous strips of the two-sided electrodes are wound into a roll form and separated by the single separator forming a stack comprising a two-sided negative electrode and a two-sided positive electrode, wherein the energy storage cell is wound into a roll;

wherein the method further comprises contacting each of the first electrodes and each of the second electrodes with multiple electrically conductive tabs that extend beyond the energy storage cell and laterally sideways offsetting the electrically conductive tabs from each other to accommodate for an increasing radius of the energy storage cell in the roll;

wherein the multiple electrically conductive tabs collectively result in leaders aligned with electrical pads of the body;

wherein the energy storage cell is an ultracapacitor capable of surviving reflow processing; and disposing a lid onto the body cavity.

14. The method of claim 13, further comprising disposing on the body or the lid a printed circuit board.

* * * * *